(12) United States Patent
Martin et al.

(10) Patent No.: US 10,020,456 B2
(45) Date of Patent: Jul. 10, 2018

(54) ETHER-BASED POLYMERS AS PHOTO-CROSSLINKABLE DIELECTRICS

(71) Applicant: BASF SE, Ludwigshafen (DE)

(72) Inventors: Emmanuel Martin, Folgensbourg (FR); Fulvio G. Brunetti, Singapore (SG); Mi Zhou, Seoul (KR); Stefan Becker, Seoul (KR); Daniel Kaelblein, Mannheim (DE); Chao Wu, Mannheim (DE); Raimond Praptana, Singapore (SG); Konrad Knoll, Mannheim (DE); Jordan Thomas Kopping, Allschwil (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/514,180

(22) PCT Filed: Aug. 13, 2015

(86) PCT No.: PCT/IB2015/056180
§ 371 (c)(1),
(2) Date: Mar. 24, 2017

(87) PCT Pub. No.: WO2016/046659
PCT Pub. Date: Mar. 31, 2016

(65) Prior Publication Data
US 2017/0250358 A1    Aug. 31, 2017

(30) Foreign Application Priority Data

Sep. 25, 2014   (EP) ..................................... 14186306

(51) Int. Cl.
| | | |
|---|---|---|
| *C08L 27/12* | (2006.01) |
| *H01L 51/05* | (2006.01) |
| *C09D 125/18* | (2006.01) |
| *C08F 12/32* | (2006.01) |
| *H01L 51/00* | (2006.01) |

(52) U.S. Cl.
CPC ............ *H01L 51/052* (2013.01); *C08F 12/32* (2013.01); *C09D 125/18* (2013.01); *H01L 51/004* (2013.01); *H01L 51/0043* (2013.01)

(58) Field of Classification Search
CPC .............................. C08F 12/32; C09D 125/18
See application file for complete search history.

(56) References Cited

U.S. PATENT DOCUMENTS

| | | |
|---|---|---|
| 7,582,896 B2 | 9/2009 | Halik et al. |
| 7,825,404 B2 | 11/2010 | Halik et al. |
| 8,878,169 B2 * | 11/2014 | Usta et al. |
| 8,937,301 B2 * | 1/2015 | Quinn et al. |
| 2004/0180988 A1 | 9/2004 | Bernius et al. |
| 2005/0260803 A1 | 11/2005 | Halik et al. |
| 2006/0145149 A1 | 7/2006 | Halik et al. |
| 2006/0202198 A1 | 9/2006 | Halik et al. |
| 2008/0315192 A1 | 12/2008 | Halik et al. |
| 2009/0256139 A1 | 10/2009 | Wu et al. |
| 2011/0215334 A1 | 9/2011 | Quinn et al. |
| 2012/0034736 A1 | 2/2012 | Wu et al. |
| 2014/0363690 A1 | 12/2014 | Quinn et al. |

FOREIGN PATENT DOCUMENTS

| | | |
|---|---|---|
| EP | 1 078 970 A1 | 2/2001 |
| EP | 2 109 161 A1 | 10/2009 |
| JP | 61-167901 A | 7/1986 |
| JP | 2009-067894 A | 4/2009 |
| WO | WO 2005/023876 A2 | 3/2005 |

(Continued)

OTHER PUBLICATIONS

International Search Report and Written Opinion dated Nov. 27, 2015 in PCT/IB2015/056180.
International Preliminary Report on Patentability dated Apr. 6, 2017 in PCT/IB2015/056180.
Extended European Search Report dated Mar. 20, 2015 in Patent Application No. 14186306.8.
Friederike Fleischhaker, et al., "ZnO Based Field-Effect Transistors (FETs): Solution-Processable at Low Temperatures on Flexible Substrates" Journal of Materials Chemistry, vol. 20, No. 32, 2010, XP009171790, pp. 6622-6625.
A. Gustafsson, et al., "Electrical Degradation of Polymers of Styrene and Substituted Styrenes. 2" Polymer Bulletin, vol. 31, No. 1, 1993, XP000382476, pp. 61-68.
Dongpo Peng, et al., "A 2,2'-bipyridine-palladacycle catalyzed the coupling of arylboronic acids with nitroarenes" Tetrahedron, vol. 69, No. 33, Aug. 2013, pp. 6884-6889.
Supplementary European Search Report dated Mar. 3, 2018, in European Patent Application No. 15845021.3 (filed Aug. 13, 2015).

*Primary Examiner* — Hannah J Pak
(74) *Attorney, Agent, or Firm* — Oblon, McClelland, Maier & Neustadt, L.L.P.

(57) ABSTRACT

Polymers comprising at least one unit of formula (1) wherein n is 0 or 1, m and p are independently from each other 0, 1, 2, 3, 4, 5 or 6, provided that the sum of n, m and p is at least 2, and n and p are not 0 at the same time, $Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, and $X^1$, $X^2$ and $X^3$ are independently from each other and at each occurrence O or S, compositions comprising these polymers, and electronic devices comprising a layer formed from the compositions. Preferably, the electronic device is an organic field effect transistor and the layer is the dielectric layer.

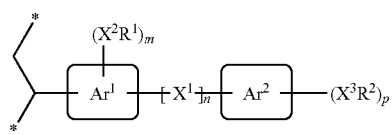

(1)

17 Claims, 1 Drawing Sheet

(56) References Cited

FOREIGN PATENT DOCUMENTS

| | | |
|---|---|---|
| WO | WO 2005/023940 A2 | 3/2005 |
| WO | WO 2005/049695 A1 | 6/2005 |
| WO | WO 2008/000664 A1 | 1/2008 |
| WO | WO 2010/049321 A1 | 5/2010 |
| WO | WO 2010/049323 A1 | 5/2010 |
| WO | WO 2010/057984 A2 | 5/2010 |
| WO | WO 2010/108873 A1 | 9/2010 |
| WO | WO 2010/115767 A1 | 10/2010 |
| WO | WO 2010/136352 A1 | 12/2010 |
| WO | WO 2010/136353 A1 | 12/2010 |
| WO | WO 2013/083506 A1 | 6/2013 |
| WO | WO 2013/119717 A1 | 8/2013 |

* cited by examiner

ETHER-BASED POLYMERS AS PHOTO-CROSSLINKABLE DIELECTRICS

The present invention relates to polymers, to compositions comprising these polymers, and to electronic devices comprising a layer formed from the compositions. Preferably, the electronic device is an organic field effect transistor and the layer is the dielectric layer.

Dielectric materials can be applied in many electronic devices such as field effect transistors (FETs). Field effect transistors (FETs) can be used in applications that require electronic functionalities such as displays, large-area sensors and radio-frequency identification (RFID) tags.

Field effect transistors contain a semiconducting layer that is separated from the metal gate electrode by a thin dielectric layer. When voltage is applied between the gate and the semiconductor, a thin sheet of mobile electronic charges is created in the semiconductor in close vicinity of the semiconductor/dielectric interface. This charge layer balances the charge (of opposite polarity) located on the gate electrode. By tuning the gate voltage, the charge density in the semiconductor channel can be modulated over a wide range ad as a result the electric conductivity of the charge-carrier channel changes dramatically. With two metal contacts attached to the semiconductor (the source contact and drain contact), the electric current flowing through the transistor can therefore be efficiently controlled over a wide range, simply by adjusting the gate voltage.

It is desirable that the dielectric material forming the dielectric layer is an organic material which is compatible with liquid processing techniques such as spin coating as liquid processing techniques allows the production of low cost electronic devices comprising field-effect transistors. In addition, liquid processing techniques are also compatible with plastic substrates, and thus allow the production of light weight and mechanically flexible electronic devices comprising field effect transistors.

The dielectric material should ideally show a large gate coupling (i.e. large gate dielectric capacitance per unit area) and small leakage currents. Large gate coupling (i.e. large gate dielectric capacitance per unit area) means that the transistors can be operated with low voltages, which is important when the field-effect transistors are designed for portable or handheld devices that are powered by small batteries or by near-field radio-frequency coupling. Also, a large dielectric capacitance ensures that the carrier density in the channel is controlled by the gate-source voltage and not by the source-drain voltage, which is especially critical for field-effect transistors with short channel length.

Polystyrene is a common dielectric material for use in organic-field effect transistors.

However, there is still a need for dielectric materials, which are suitable for preparing the dielectric layer in a field effect transistor, in particular for dielectric materials, which are suitable for preparing the dielectric layer in a field effect transistor, which transistor can be operated with lower voltages.

Therefore it was the object of the present invention to provide dielectric materials which are suitable for preparing the dielectric layer in a field effect transistor, and which are preferably suitable for preparing the dielectric layer in a field effect transistor, which transistor can be operated with low voltages.

This object is solved by the polymers of claim 1, the composition of claim 13, the process of claim 15 and the electronic device of claim 16.

The dielectric materials of the present invention are polymers comprising at least one unit of formula

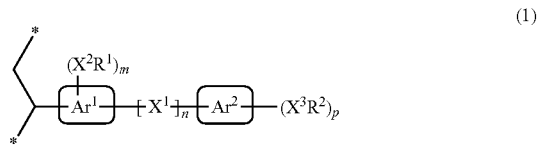

(1)

wherein
n is 0 or 1,
m and p are independently from each other 0, 1, 2, 3, 4, 5 or 6,
provided that the sum of n, m and p is at least 2, and n and p are not 0 at the same time,
$Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
$X^1$, $X^2$ and $X^3$ are independently from each other and at each occurrence O or S,
$R^1$ and $R^2$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
  wherein
  $C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
  $C_{5-8}$-cycloalkyl can be substituted with 1 to 5 substituents independently selected from the group consisting of halogen, $C_{1-10}$-alkyl, CN, $C_{2-10}$-alkenyl, $C_{2-10}$-alkynyl, $C_{6-10}$-aryl and 5 to 10 membered heteroaryl,
  and
  $C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

Halogen can be F, Cl, Br and I.

$C_{1-6}$-alkyl, $C_{1-10}$-alkyl, $C_{1-20}$-alkyl and $C_{1-30}$-alkyl can be branched or unbranched. Examples of $C_{1-6}$-alkyl are methyl, ethyl, n-propyl, isopropyl, n-butyl, sec-butyl, isobutyl, tert-butyl, n-pentyl, neopentyl, isopentyl, n-(1-ethyl)propyl and n-hexyl. Examples of $C_{1-10}$-alkyl are $C_{1-6}$-alkyl and n-heptyl, n-octyl, n-(2-ethyl)hexyl, n-nonyl and n-decyl. Examples of $C_{1-20}$-alkyl are $C_{1-10}$-alkyl and n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$). Examples of $C_{1-30}$-alkyl are $C_{1-20}$-alkyl and n-docosyl ($C_{22}$), n-tetracosyl ($C_{24}$), n-hexacosyl ($C_{26}$), n-octacosyl ($C_{28}$) and n-triacontyl ($C_{30}$).

$C_{1-10}$-alkylene can be branched or unbranched. Examples of $C_{1-10}$-alkylene are methylene, ethylene, n-propylene, n-butylene, n-pentylene, n-hexylene, n-heptylene, n-octylene, n-nonylene and n-decylene.

$C_{2-10}$-alkenyl, $C_{2-20}$-alkenyl and $C_{2-30}$-alkenyl can be branched or unbranched. Examples of $C_{2-10}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of $C_{2-20}$-alkenyl are $C_{2-10}$-alkenyl and linoleyl ($C_{18}$), linolenyl ($C_{18}$), oleyl (C$_{18}$), and arachidonyl (C$_{20}$). Examples of C$_{2-30}$-alkenyl, C$_{2-60}$-alkenyl and C$_{2-100}$-alkenyl are C$_{2-20}$-alkenyl and erucyl (C$_{22}$).

C$_{2-10}$-alkynyl, C$_{2-20}$-alkynyl and C$_{2-30}$-alkynyl can be branched or unbranched. Examples of C$_{2-10}$alkynyl are ethynyl, 2-propynyl, 2-butynyl, 3-butynyl, pentynyl, hexynyl, heptynyl, octynyl, nonynyl and decynyl. Examples of C$_{2-20}$-alkynyl and C$_{2-30}$-alkynyl are C$_{2-10}$-alkynyl and undecynyl, dodecynyl, undecynyl, dodecynyl, tridecynyl, tetradecynyl, pentadecynyl, hexadecynyl, heptadecynyl, octadecynyl, nonadecynyl and icosynyl (C$_{20}$).

Examples of C$_{5-6}$-cycloalkyl are cyclopentyl and cyclohexyl. Examples of C$_{5-8}$-cycloalkyl are C$_{5-6}$-cycloalkyl and cycloheptyl and cyclooctyl.

Examples of C$_{5-7}$-cycloalkylene are cyclopentylene, cyclohexylene and cycloheptylene.

Examples of C$_{6-10}$-aryl are phenyl,

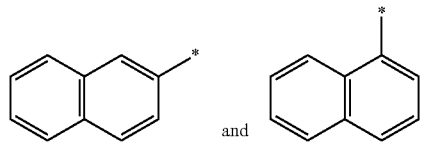

Examples of C$_{6-14}$-aryl are C$_{6-10}$-aryl and

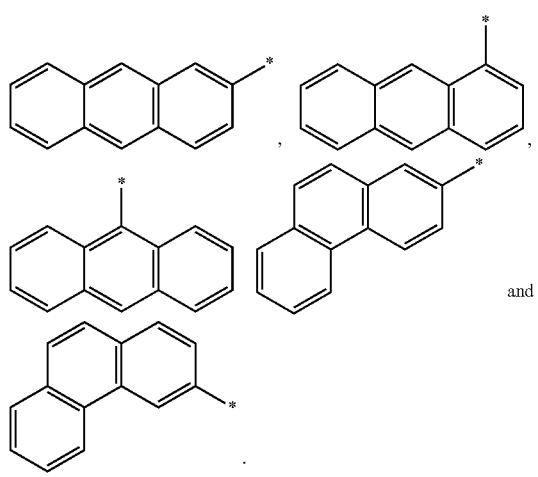

C$_{6-14}$-arylene is a 6 to 14 membered monocyclic or polycyclic, such as dicyclic, tricyclic or tetracyclic, ring system, which comprises at least one C-aromatic ring, and which may also comprise non-aromatic rings, which may be substituted by =O or C=CH$_2$.

Examples of C$_{6-14}$-arylene are

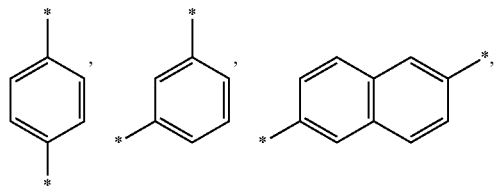

-continued

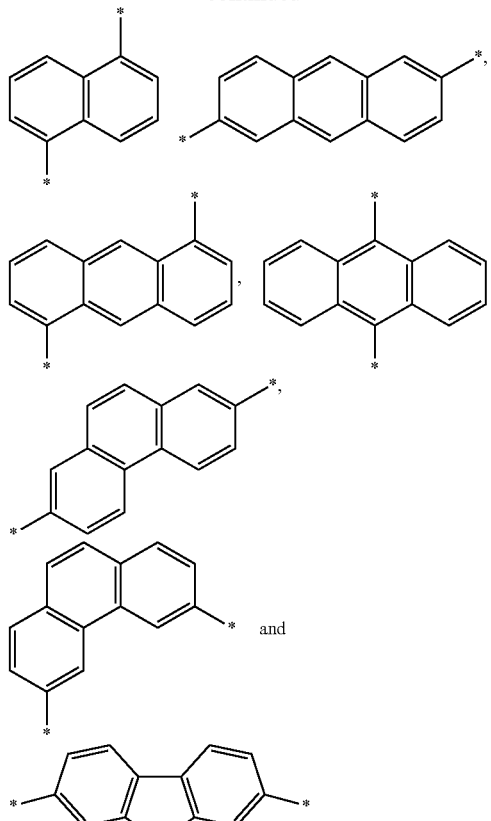

5 to 10 membered heteroaryl are 5 to 10 membered monocyclic or polycyclic, such as dicyclic, tricyclic or tetracyclic, ring systems, which comprise at least one heteroaromatic ring, and which may also comprise non-aromatic rings, which may be substituted by =O or by C=CH$_2$.

5 to 14 membered heteroaryl are 5 to 14 membered monocyclic or polycyclic, such as dicyclic, tricyclic or tetracyclic, ring systems, which comprise at least one heteroaromatic ring, and which may also comprise non-aromatic rings, which may be substituted by =O or by C=CH$_2$.

Examples of 5 to 10 membered heteroaryl are

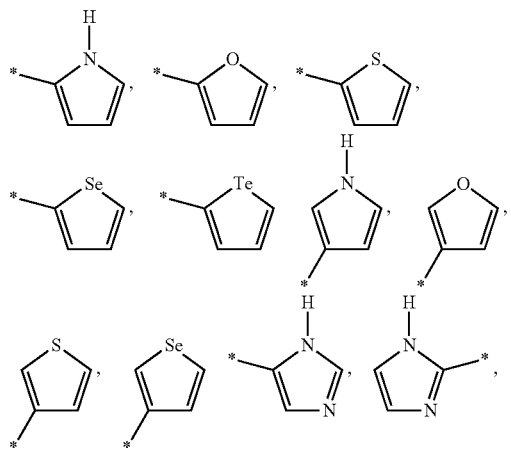

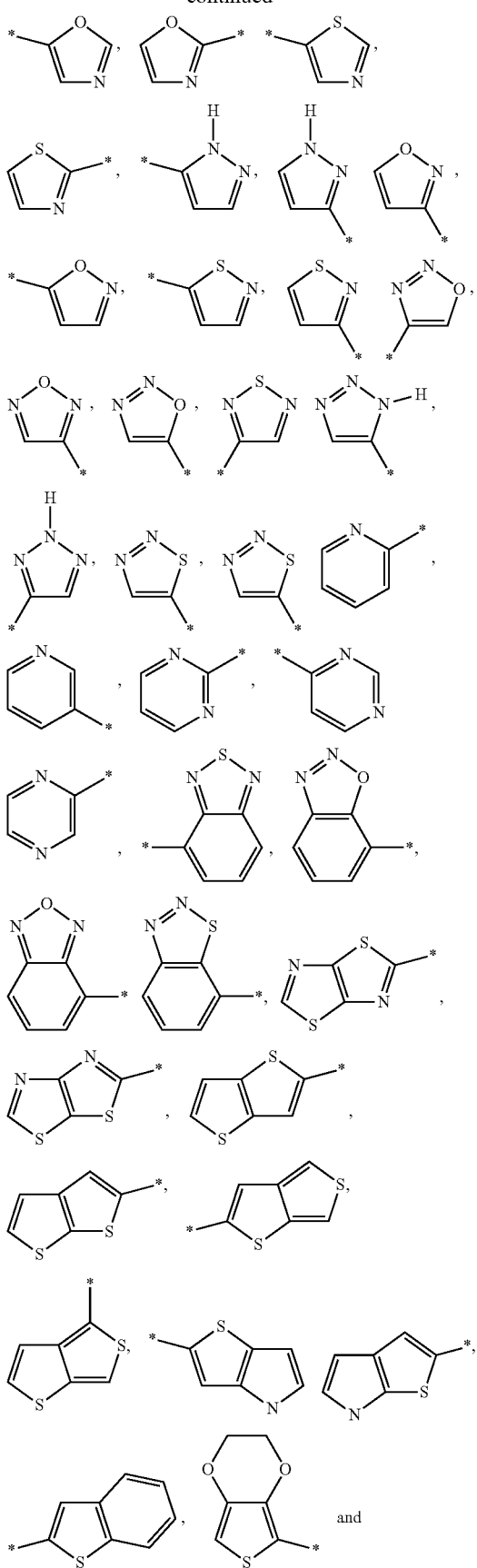
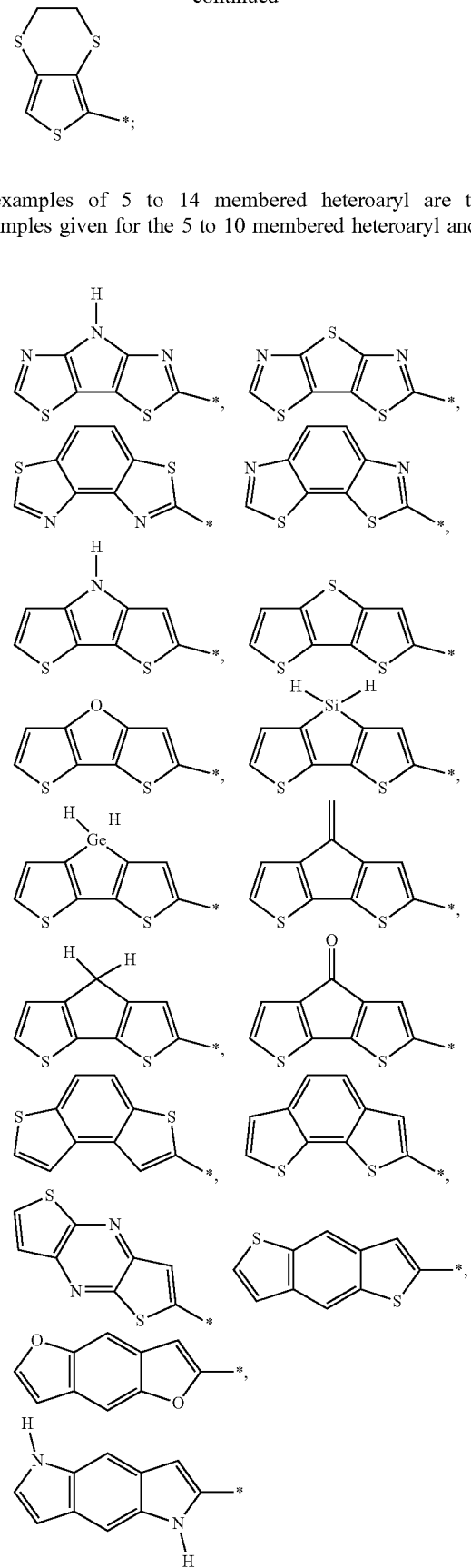
examples of 5 to 14 membered heteroaryl are the examples given for the 5 to 10 membered heteroaryl and

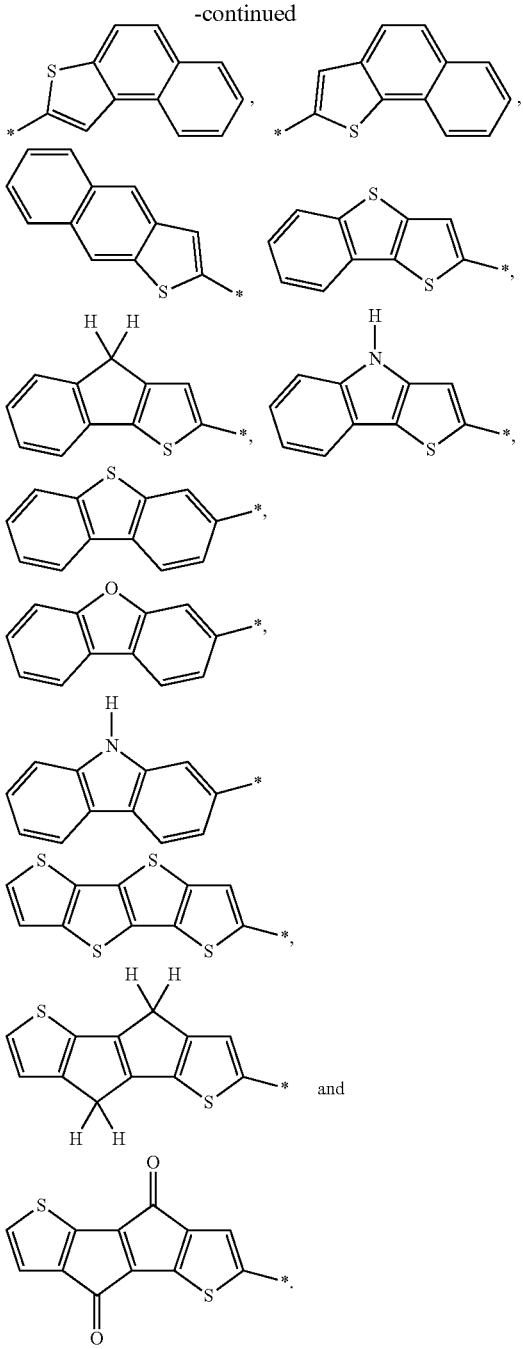
5 to 14 membered heteroarylene is a 5 to 14 membered monocyclic or polycyclic, such as dicyclic, tricyclic or tetracyclic, ring system, which comprises at least one heteroaromatic ring, and which may also comprise non-aromatic rings, which may be substituted by =O or C=CH$_2$.
Examples of 5 to 14 membered heteroarylene are
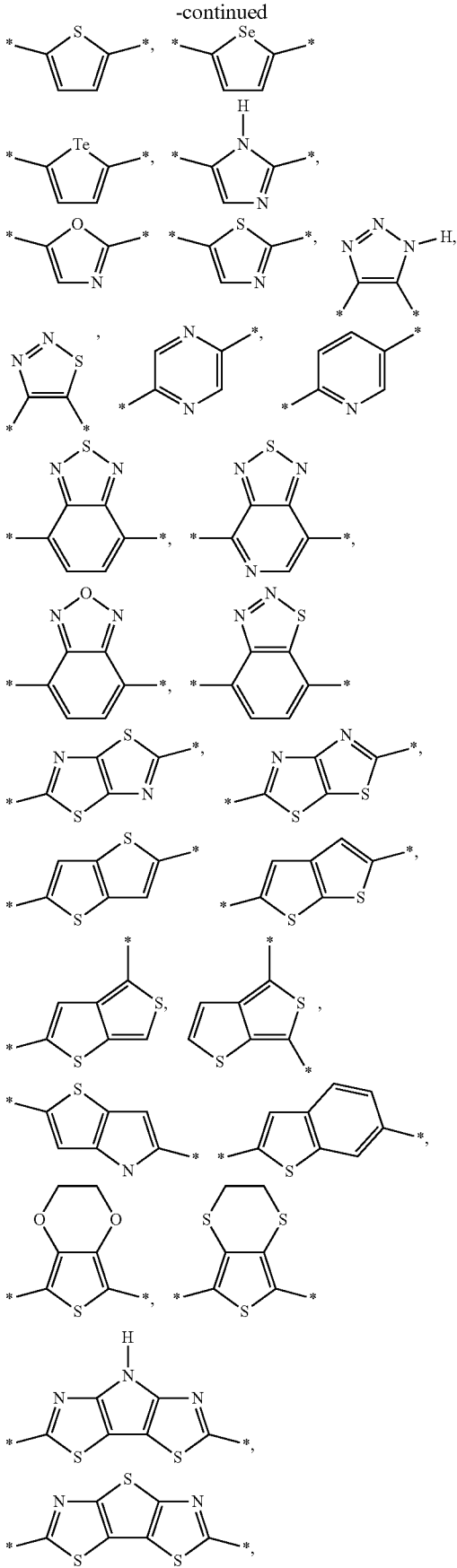

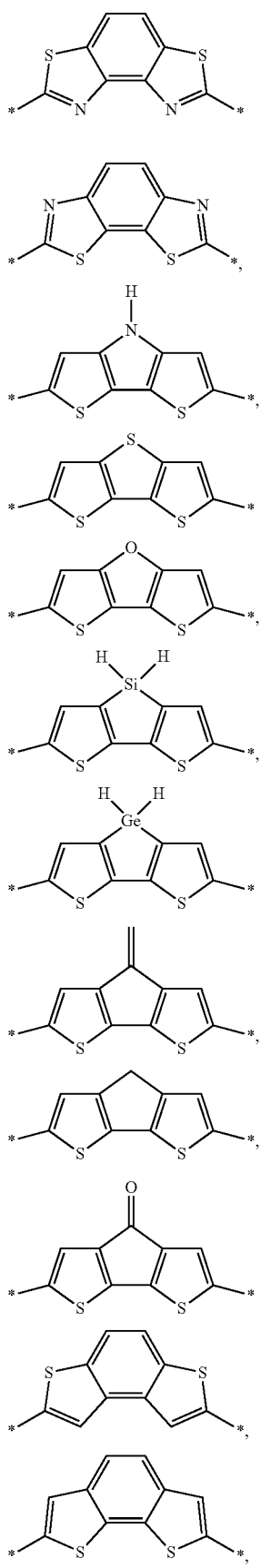
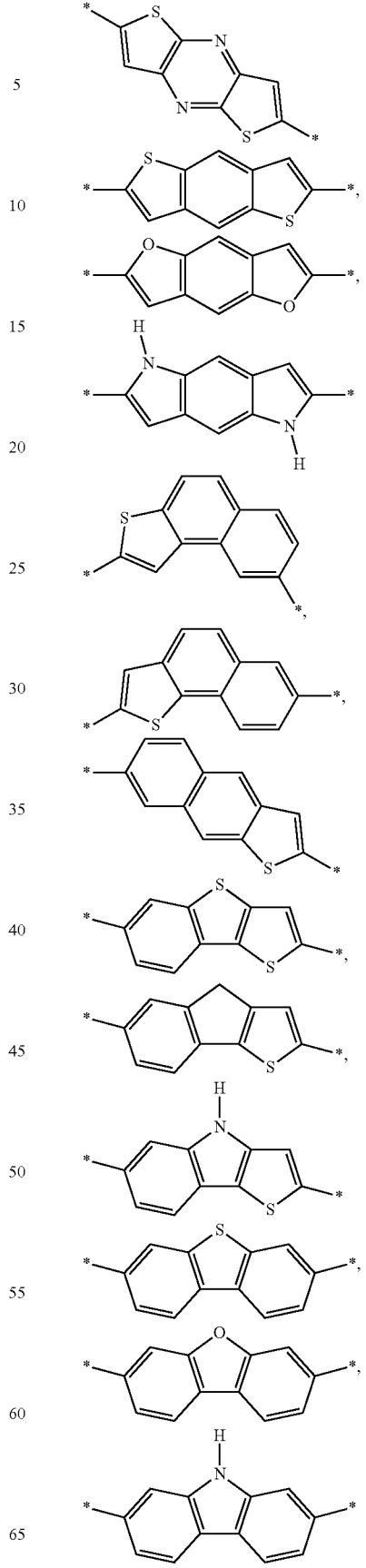

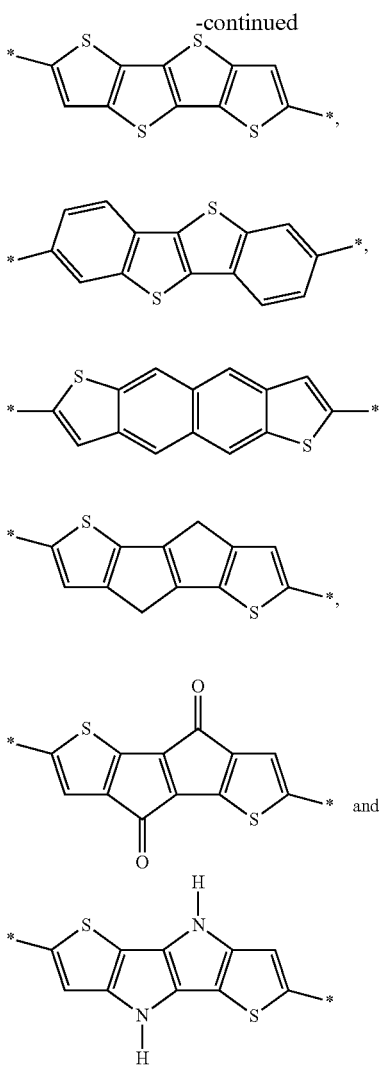

Preferably,
n is 0 or 1,
m and p are independently from each other 0, 1, 2, 3 or 4, provided that the sum of n, m and p is at least 2, and n and p are not 0 at the same time.

More preferably,
n is 0 or 1,
m and p are independently from each other 0, 1, 2, 3 or 4, provided that the sum of n and p is at least 2.

Most preferably,
n is 0 or 1,
m and p are independently from each other 0, 1, 2, 3 or 4, provided that the sum of n and p is at least 3.

Preferably, $Ar^1$ and $Ar^2$ are independently from each other phenylene or phenyl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
wherein
$C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl, 5 to 10 membered heteroaryl,
$C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
and
$C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$alkynyl and $C_{5-6}$-cycloalkyl.

More preferably, $Ar^1$ and $Ar^2$ are independently from each other phenylene or phenyl, which may be substituted with 1 to 4 substituents independently selected from the group consisting of $C_{1-20}$-alkyl, $C_{2-20}$-alkenyl and $C_{2-20}$-alkynyl,
wherein
$C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl.

Most preferably, $Ar^1$ and $Ar^2$ are independently from each other unsubstituted phenylene or phenyl.

Preferably, $X^1$, $X^2$ and $X^3$ are O.

Preferably, $R^1$ and $R^2$ are independently from each other and at each occurrence selected from the group consisting of $C_{1-20}$-alkyl, $C_{2-20}$-alkenyl, $C_{2-20}$-alkynyl and phenyl,
wherein
$C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
and
phenyl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

More preferably, $R^1$ and $R^2$ are independently from each other and at each occurrence selected from the group consisting of $C_{1-10}$-alkyl and phenyl,
wherein
$C_{1-10}$-alkyl can be substituted with 1 to 5 substituents independently selected from the group consisting of halogen and phenyl,
and
phenyl can be substituted with 1 to 5 substituents independently selected from the group consisting of halogen and $C_{1-6}$-alkyl.

Even more preferably, $R^1$ and $R^2$ are $C_{1-6}$-alkyl
wherein
$C_{1-6}$-alkyl can be substituted with 1 to 3 halogen.

Most preferably, $R^1$ and $R^2$ are methyl
wherein
methyl can be substituted with 1 to 3 halogen.

Preferred polymers of the present invention comprise at least one unit of formula

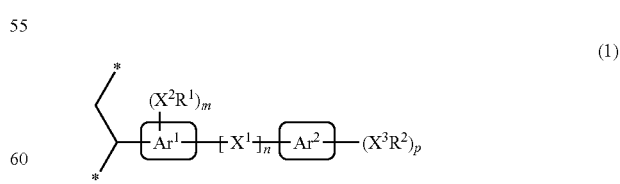

(1)

wherein
n is 0 or 1,
m and p are independently from each other 0, 1, 2, 3 or 4, provided that the sum of n, m and p is at least 2, and n and p are not 0 at the same time, Ar¹ and Ar² are independently from each other phenylene or phenyl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
wherein
$C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl, 5 to 10 membered heteroaryl,
$C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
and
$C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl,
$X^1$, $X^2$ and $X^3$ are independently from each other and at each occurrence O or S,
$R^1$ and $R^2$ are independently from each other and at each occurrence selected from the group consisting of $C_{1-20}$-alkyl, $C_{2-20}$-alkenyl, $C_{2-20}$-alkynyl and phenyl,
wherein
$C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
and
phenyl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

More preferred polymers of the present invention comprise at least one unit of formula

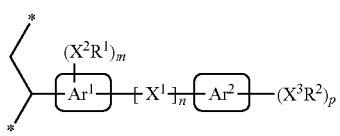

(1)

wherein
n is 0 or 1,
m and p are independently from each other 0, 1, 2, 3 or 4, provided that the sum of n and p is at least 2,
Ar¹ and Ar² are independently from each other phenylene or phenyl, which may be substituted with 1 to 4 substituents independently selected from the group consisting of $C_{1-20}$-alkyl, $C_{2-20}$-alkenyl and $C_{2-20}$-alkynyl,
wherein
$C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
$X^1$, $X^2$ and $X^3$ are O,
$R^1$ and $R^2$ are independently from each other and at each occurrence selected from the group consisting of $C_{1-10}$-alkyl and phenyl,
wherein
$C_{1-10}$-alkyl can be substituted with 1 to 5 substituents independently selected from the group consisting of halogen and phenyl, and
phenyl can be substituted with 1 to 5 substituents independently selected from the group consisting of halogen and $C_{1-6}$-alkyl.

Most preferred polymers of the present invention comprise at least one unit of formula

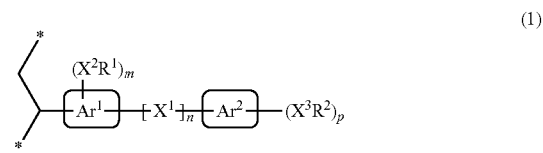

(1)

wherein
n is 0 or 1,
m and p are independently from each other 0, 1, 2, 3 or 4, provided that the sum of n and p is at least 3,
Ar¹ and Ar² are independently from each other unsubstituted phenylene or phenyl,
$X^1$, $X^2$ and $X^3$ are O, and
$R^1$ and $R^2$ are $C_{1-6}$-alkyl,
wherein
$C_{1-6}$-alkyl can be substituted with 1 to 3 halogen.

Preferably, the polymers of the present invention have a mass-average molecular weight Mw in the range of 1'000 to 1'000'000 Da. More preferably, the polymers of the present invention have a mass-average molecular weight Mw in the range of 10'000 to 500'000 Da. Most preferably, the polymers of the present invention have a mass-average molecular weight Mw in the range of 50'000 to 250'000 Da. The mass average molecular weight can be measured by gel permeation chromatography using polystyrene as standard.

Preferably, the polymers of the present invention have a relative permittivity (at 1 kHz, 25° C.) in the range of 2.0 to 4.5. More preferably, the polymers of the present invention have a relative permittivity (at 1 kHz, 25° C.) in the range of 2.8 to 4.5. Most preferably, the polymers of the present invention have a relative permittivity (at 1 kHz, 25° C.) in the range of 3.2 to 4.2. The relative permittivity can be measured as follows: a capacitor is prepared using indium tin oxide (ITO) and gold as electrodes and the polymer of the present invention as dielectric material. The capacitance is measured at 25° C. using an LCR meter (Agilent E4980 A). The relative permittivity k is derived from the following equation $$k = Cd/\varepsilon A$$

wherein C is the measured capacitance, ε is the vacuum permittivity constant, d is the distance between the two electrodes, and A is the area of overlap of the two electrodes.

Preferably, the polymers of the present invention comprise at least 30% by weight of the units of formula (1) based on the weight of the polymer.

The polymer can be either a homopolymer essentially consisting of units of formula (1) or a copolymer.

Preferred copolymers comprise at least one unit of formula

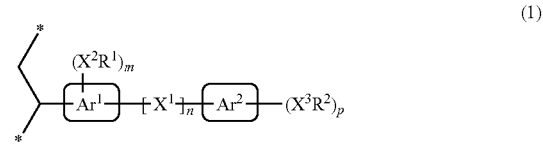

(1)

and at least one unit of formula

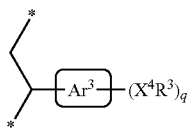
(10)

wherein
n is 0 or 1,
m and p are independently from each other 0, 1, 2, 3, 4, 5 or 6,
provided that the sum of n, m and p is at least 2, and n and p are not 0 at the same time,
q is 0, 1, 2, 3, 4, 5 or 6,
$Ar^1$, $Ar^2$ and $Ar^3$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
$X^1$, $X^2$, $X^3$, and $X^4$ are independently from each other and at each occurrence O or S,
$R^1$, $R^2$ and $R^3$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
wherein
$C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
$C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
and
$C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

More preferred copolymers comprise at least one unit of formula

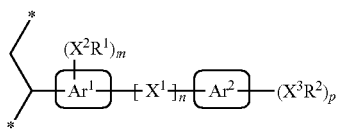
(1)

and at least one unit of formula

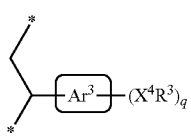
(10)

wherein
n is 0 or 1,
m and p are independently from each other 0, 1, 2, 3 or 4,
provided that the sum of n, m and p is at least 2, and n and p are not 0 at the same time,
q is 0, 1, 2, 3 or 4,
$Ar^1$, $Ar^2$ and $Ar^3$ are independently from each other phenylene or phenyl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
wherein
$C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl, 5 to 10 membered heteroaryl,
$C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
and
$C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$alkynyl and $C_{5-6}$-cycloalkyl,
$X^1$, $X^2$, $X^3$ and $X^4$ are independently from each other and at each occurrence O or S,
$R^1$, $R^2$ and $R^3$ are independently from each other and at each occurrence selected from the group consisting of $C_{1-20}$-alkyl, $C_{2-20}$-alkenyl, $C_{2-20}$-alkynyl and phenyl,
wherein
$C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
and
phenyl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

Most preferred copolymers comprise at least one unit of formula

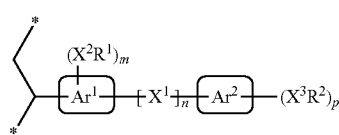
(1)

and at least one unit of formula

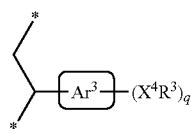
(10)

wherein
n is 0 or 1,
m and p are independently from each other 0, 1, 2, 3 or 4,
provided that the sum of n and p is at least 2,
q is 0, 1, 2, 3 or 4,
$Ar^1$, $Ar^2$ and $Ar^3$ are independently from each other phenylene or phenyl, which may be substituted with 1 to 4 substituents independently selected from the group consisting of $C_{1-20}$-alkyl, $C_{2-20}$-alkenyl and $C_{2-20}$-alkynyl, wherein $C_{1-20}$-alkyl, $C_{2-20}$-alkenyl and $C_{2-20}$-alkynyl can be substituted with 1 to 5 substituents independently selected from the group consisting of halogen, CN, $C_{5-6}$-cycloalkyl, $C_{6-10}$-aryl and 5 to 10 membered heteroaryl, $X^1$, $X^2$, $X^3$ and $X^4$ are O, $R^1$, $R^2$ and $R^3$ are independently from each other and at each occurrence selected from the group consisting of $C_{1-10}$-alkyl and phenyl, wherein $C_{1-10}$-alkyl can be substituted with 1 to 5 substituents independently selected from the group consisting of halogen and phenyl, and phenyl can be substituted with 1 to 5 substituents independently selected from the group consisting of halogen and $C_{1-6}$-alkyl.

In particular copolymers comprise at least one unit of formula

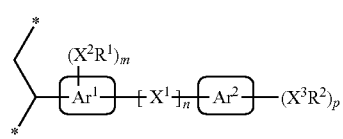

(1)

and at least one unit of formula

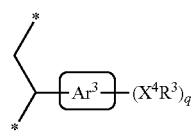

(10)

wherein
n is 0 or 1,
m and p are independently from each other 0, 1, 2, 3 or 4,
provided that the sum of n and p is at least 3,
q is 0, 1, 2 or 3,
$Ar^1$, $Ar^2$ and $Ar^3$ are independently from each other phenylene or phenyl,
$X^1$, $X^2$, $X^3$ and $X^4$ are O, and
$R^1$, $R^2$ and $R^3$ are $C_{1-6}$-alkyl, wherein $C_{1-6}$-alkyl can be substituted with 1 to 3 halogen.

The molar ratio of the units of formula (1)/units of formula (2) in the copolymer is usually in the range of 1/5 to 5/1. Preferably, the molar ratio of the units of formula (1)/units of formula (2) in the copolymer is in the range of 1/3 to 3/1. More preferably, the molar ratio of the units of formula (1)/units of formula (2) in the copolymer is in the range of 1/2 to 1/1.

The copolymers are preferably random copolymers.

Particular preferred polymers of the present invention are the polymers of formulae

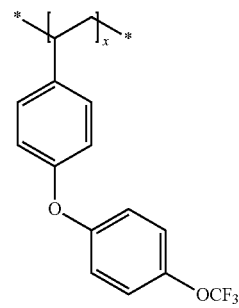

Pa

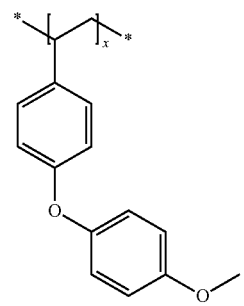

Pb

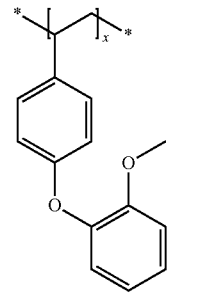

Pc

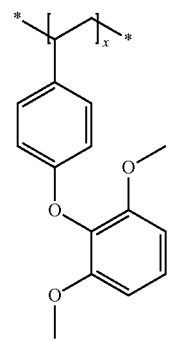

Pd

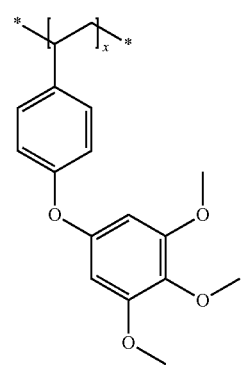

Pe

-continued

Pf
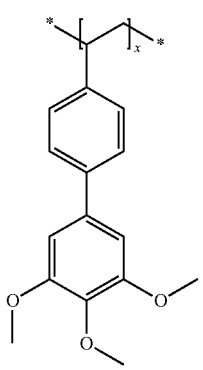

Pg
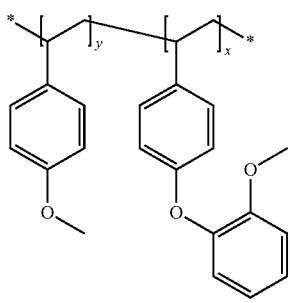

Ph
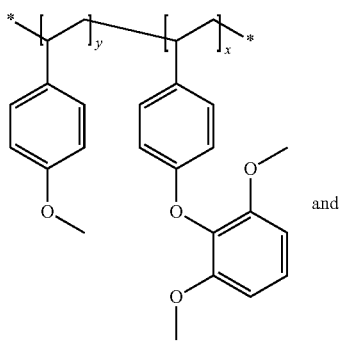

Pi
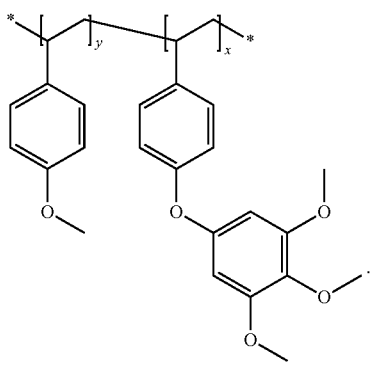

The polymers of the present invention can be prepared by methods known in the art.

For example, the polymers of the present invention comprising at least one unit of formula

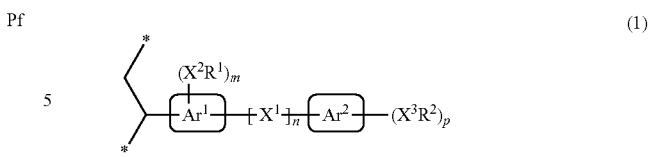

wherein n is 0 or 1, m and p are independently from each other 0, 1, 2, 3, 4, 5 or 6, provided that the sum of n, m and p is at least 2, and n and p are not 0 at the same time, $Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, $X^1$, $X^2$ and $X^3$ are independently from each other and at each occurrence O or S, $R^1$ and $R^2$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, wherein $C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl, $C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl, and $C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl, can be prepared by polymerizing a compound of formula

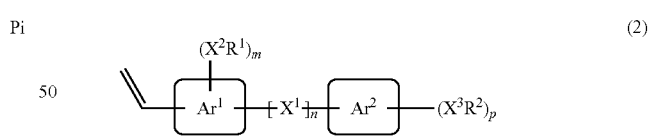

wherein n, m, p, $Ar^1$, $Ar^2$, $X^1$, $X^2$, $X^3$, $R^1$ and $R^2$ are as defined for the compound of formula (1).

The polymerization is usually performed at elevated temperatures, for example at a temperature in the range of 60 to 150° C. The polymerization can be performed in the presence of a polymerization initiator. Suitable polymerization initiators are azo-compounds such as 1,1'-azobis(cyclohexanecarbonitrile) or peroxide compounds such as dicumyl peroxide. The polymerization can be performed in the presence of suitable other vinylic compounds.

Preferred copolymers are prepared in the presence of compounds of formula

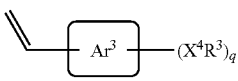

(9)

wherein q is 0, 1, 2, 3, 4, 5 or 6, $Ar^3$ is $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, $X^4$ is at each occurrence O or S, $R^3$ is at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, wherein
  $C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
  $C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
  and
  $C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl.

Compounds of formula (2)

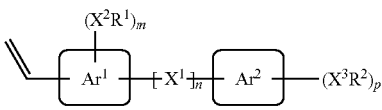

(2)

wherein n is 0 or 1, m and p are independently from each other 0, 1, 2, 3, 4, 5 or 6, provided that the sum of n, m and p is at least 2, and n and p are not 0 at the same time, $Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, $X^1$, $X^2$ and $X^3$ are independently from each other and at each occurrence O or S, $R^1$ and $R^2$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, wherein
  $C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
  $C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
  and
  $C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl, can be prepared by treating a compound of formula

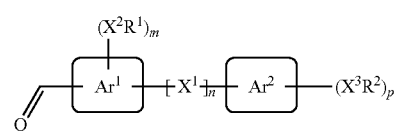

(3)

wherein n, m, p, $Ar^1$, $Ar^2$, $X^1$, $X^2$, $X^3$, $R^1$ and $R^2$ are as defined for the compound of formula (2)

with methyltriphenylphosphonium bromide in the presence of a suitable base such as potassium tert-butoxide.

Usually the reaction is performed at a temperature in the range of −40 to 0° C. Usually the reaction is performed in a suitable solvent such as THF.

Compounds of formula

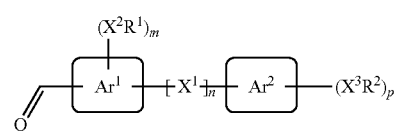

(3)

wherein n is 0 or 1, m and p are independently from each other 0, 1, 2, 3, 4, 5 or 6, provided that the sum of n, m and p is at least 2, and n and p are not 0 at the same time, $Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, $X^1$, $X^2$ and $X^3$ are independently from each other and at each occurrence O or S, $R^1$ and $R^2$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl, wherein
  $C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
  $C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
  and
  $C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl, can be prepared by reacting a compound of formula

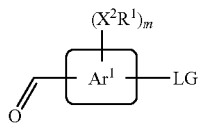
(5)

with a compound of formula

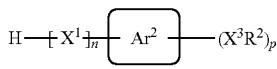
(4)

wherein
n, m, p, $Ar^1$, $Ar^2$, $X^1$, $X^2$, $X^3$, $R^1$ and $R^2$ are as defined for the compound of formula (3), and LG is $NO_2$ or halogen, in the presence of a suitable catalyst such as $Cu(OAc)_2$.

The reaction is usually performed at elevated temperatures, for examples at temperatures in the range of 60 to 150° C. The reaction is usually performed in a suitable solvent such as dimethylformamide (DMF), acetonitrile and dimethylacetamide (DMAc).

Compounds of formula

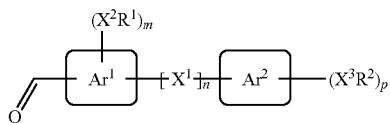
(3)

wherein
n is 0 or 1,
m and p are independently from each other 0, 1, 2, 3, 4, 5 or 6,
provided that the sum of n, m and p is at least 2, and n and p are not 0 at the same time,
$Ar^1$ and $Ar^2$ are independently from each other $C_{6-14}$-arylene or $C_{6-14}$-aryl, which may be substituted with 1 to 4 substituents independently selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
$X^2$ and $X^3$ are independently from each other and at each occurrence O or S,
$R^1$ and $R^2$ are independently from each other and at each occurrence selected from the group consisting of $C_{1-30}$-alkyl, $C_{2-30}$-alkenyl, $C_{2-30}$-alkynyl, $C_{5-8}$-cycloalkyl, $C_{6-14}$-aryl and 5 to 14 membered heteroaryl,
wherein
$C_{1-30}$-alkyl, $C_{2-30}$-alkenyl and $C_{2-30}$-alkynyl can be substituted with 1 to 5 substituents independently selected from the group consisting of halogen, CN, $C_{5-6}$-cycloalkyl, $C_{6-10}$-aryl and 5 to 10 membered heteroaryl,
$C_{5-8}$-cycloalkyl can be substituted with 1 to 5 substituents independently selected from the group consisting of halogen, CN, $C_{1-10}$-alkyl, $C_{2-10}$-alkenyl, $C_{2-10}$-alkynyl, $C_{6-10}$-aryl and 5 to 10 membered heteroaryl,
and
$C_{6-14}$-aryl and 5 to 14 membered heteroaryl can be substituted with 1 to 5 substituents independently selected from the group consisting of halogen, CN, $C_{1-10}$-alkyl, $C_{2-10}$-alkenyl, $C_{2-10}$-alkynyl and $C_{5-6}$-cycloalkyl, can be prepared by reacting a compound of formula

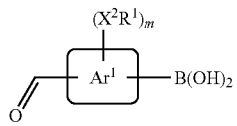
(8)

with a compound of formula

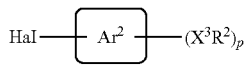
(7)

wherein
n, m, p, $Ar^1$, $Ar^2$, $X^1$, $X^2$, $X^3$, $R^1$ and $R^2$ are as defined for the compound of formula (3), and Hal is halogen, preferably Br
in the presence of a suitable catalyst such as $Pd(PPh_3)_4$ and a suitable base such as $K_2CO_3$.

The reaction is usually performed at elevated temperatures, for examples at temperatures in the range of 60 to 150° C. The reaction is usually performed in a suitable solvent such as toluene.

Also part of the present invention are compositions comprising the polymers of the present invention and a solvent.

The solvent can be any suitable solvent. Preferably, the solvent is selected from the group consisting of $C_{1-6}$-alkyl-O—$C_{1-10}$-alkylene-O—C(O)—$C_{1-6}$-alkyl, 5 to 7 membered cyclic ketones and $C_{1-10}$-alkyl $C_{1-10}$-alkanoate and mixtures thereof. An example of $C_{1-6}$-alkyl-O—$C_{1-6}$-alkylene-O—C(O)$C_{1-6}$-alkyl is propylene glycol methyl ether acetate (PGMEA). Examples of 5 to 7 membered cyclic ketones are cyclopentanone and cyclohexanone. Examples of $C_{1-10}$-alkyl $C_{1-10}$-alkanoates are ethyl butanoate and butyl acetate. More preferably, the solvent is a $C_{1-10}$-alkyl $C_{1-10}$-alkanoate or mixtures of $C_{1-10}$-alkyl $C_{1-10}$-alkanoates with $C_{1-6}$-alkyl-O—$C_{1-6}$-alkylene-O—C(O)—$C_{1-6}$-alkyl or 5 to 7 membered cyclic ketones. Most preferably, the solvent is butyl acetate.

Preferably, the compositions comprising the polymers of the present invention and a solvent also comprise a crosslinker.

The crosslinker can be any suitable crosslinker.
Preferably, the crosslinker is of formula

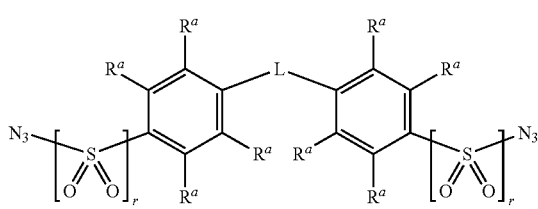
(11)

wherein
r is 0 or 1, $R^a$ is at each occurrence selected from the group consisting of H, halogen, $SO_3M$ and $C_{1-20}$-alkyl, which $C_{1-20}$-alkyl can be substituted with one or more halogen,
wherein M is Na, K or Li,
and
L is a linking group.

L can be any suitable linking group. Preferably, L is a linking group of formula

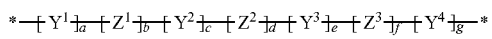

(12)

wherein
a, b, c, d, e, f and g are independently from each other 0 or 1, provided that a, b, c, d, e, f and g are not all at the same time 0,
$Y^1, Y^2, Y^3$ and $Y^4$ are selected from the group consisting of C(O), C(O)O, C(O)—$NR^b$, $SO_2$—$NR^b$, $NR^b$, $NR^bR^{b+}$, $CR^c$=$CR^c$ and ethynylene,
wherein
$R^b$ and $R^c$ are independently from each other H or $C_{1-10}$-alkyl, or two $R^b$ or Rc groups, which can be from different $Y^1, Y^2, Y^3$ or $Y^4$, together with the connecting atoms form a 5, 6 or 7 membered ring, which may be substituted with one to three $C_{1-6}$-alkyls,
$Z^1, Z^2, Z^3$ and $Z^4$ are selected from the group consisting of $C_{1-10}$-alkylene, $C_{5-7}$-cycloalkylene, 6 to 14 membered arylene and 5 to 14 membered heteroarylene,
wherein
$C_{1-10}$-alkylene, $C_{5-7}$-cycloalkylene, 6 to 14 membered arylene and 5 to 14 membered heteroarylene can be substituted with one to five $C_{1-10}$-alkyl or phenyl.
Examples of linking groups L are

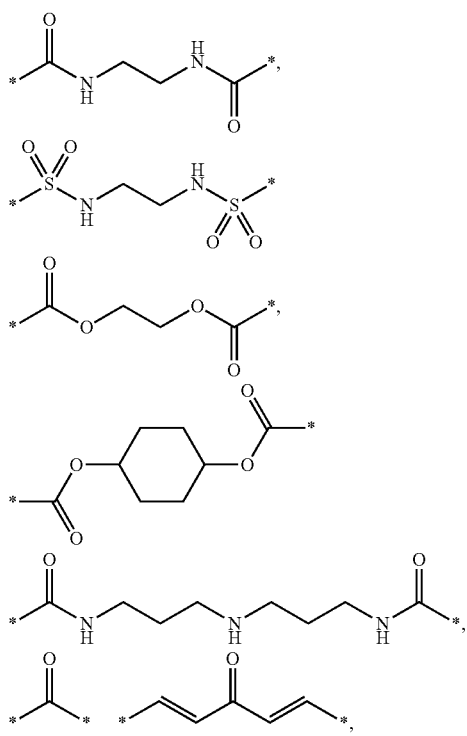

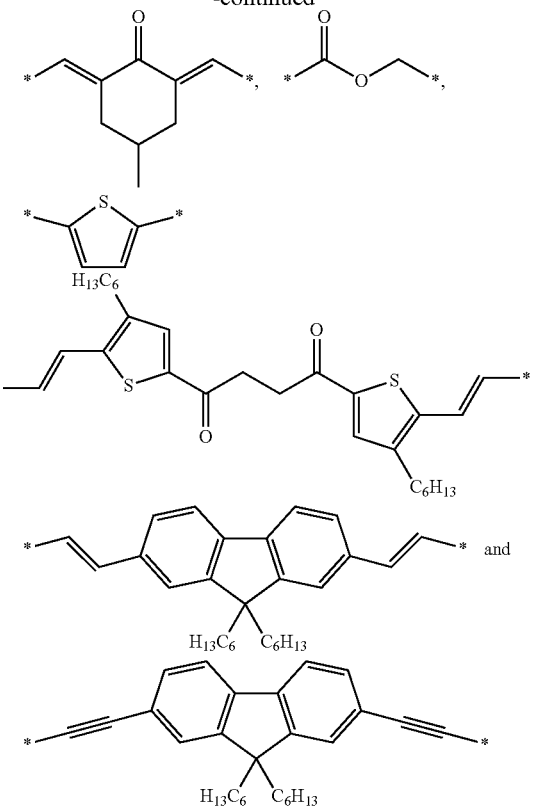

More preferably, the composition essentially contains
(i) 10 to 500 mg of a polymer of the present invention per 1 mL of the solvent,
(ii) solvent, and
(iii) 0.1 to 20% by weight of a crosslinker based on the weight of the polymer.

Most preferably, the composition essentially contains
(i) 30 to 200 mg of a polymer of the present invention per 1 mL of the solvent,
(ii) solvent, and
(iii) 1 to 10% by weight of a crosslinker based on the weight of the polymer.

Also part of the present invention is a process for preparing an electronic device which comprises a layer formed from the composition of the present invention, which process comprises the step of applying the composition of the present invention on a pre-cursor of the electronic device in order to form the layer.

The composition of the present invention can be applied by techniques known in the art. Preferably, the composition is applied by liquid processing techniques such as spin coating, blading, slot-die coating, drop-casting, spray-coating, ink-jetting or soaking of the precursor of the electronic device in the composition. Preferably, the composition is applied by spin-coating.

If the composition comprises a crosslinker of formula (12), the composition is preferably treated with light of a suitable wavelength after being applied on the precursor of the electronic device.

The electronic device can be a field-effect transistor, a capacitor, a light emitting diode, a photovoltaic device, a sensing device or a radio-frequency identification (RFID) tag.

Preferably, the electronic device is a field-effect transistor, more preferably an organic field effect transistor. An organic field effect transistor is a field effect transistor, where the semiconducting layer comprises an organic semiconducting material.

The layer formed from the composition of the present invention can be a dielectric layer, a resist layer, an insulating layer, a passivation layer, a planarization layer, an encapsulation layer or a coating layer. Preferably, the layer formed from the composition of the present invention is a dielectric layer.

Preferably, the electronic device is an organic field-effect transistor, and the layer formed from the composition of the present invention is the dielectric layer.

Usually, an organic field effect transistor comprises a dielectric layer, a semiconducting layer, a substrate, a gate electrode and source/drain electrodes.

The dielectric layer can have a thickness of 10 to 2000 nm, preferably of 50 to 1000 nm, more preferably of 100 to 800 nm. If the dielectric layer is formed from the composition of the present invention, the dielectric layer usually has a thickness of 100 to 1000 nm, preferably from 200 to 600 nm, more preferably from 300 to 500 nm.

The semiconducting layer comprises an organic semiconducting material. Examples of organic semiconducting materials are polythiophenes such as poly(3-hexylthiophene) (P3HT), polyfluorenes, polydiacetylene, poly(2,5-thienylene vinylene), poly(p-phenylene vinylene) (PPV) and polymers comprising repeating units having a diketopyrrolopyrrole group (DPP polymers). Examples of DPP polymers and their synthesis are, for example, described in EP1078970, WO 2005/049695, WO 2008/000664, WO 2010/049321, WO 2010/049323, WO 2010/108873, WO 2010/115767, WO 2010/136353 and WO 2010/136352.

Preferably the semiconducting material is a polymer comprising units having a diketopyrrolopyrrole group (DPP polymer).

Preferably, the semiconducting layer can have a thickness of 5 to 500 nm, preferably of 10 to 100 nm, more preferably of 20 to 50 nm.

The source/drain electrodes can be made from any suitable organic or inorganic source/drain material. Examples of inorganic source/drain materials are gold (Au), silver (Ag), chromium (Cr) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The channel width (W) of the organic field effect transistor is typically in the range of 10 to 2000 m and the channel length (L) of the organic field effect transistor is typically in the range of 5 to 100 m.

The precursor of the electronic device can be any suitable precursor. If the electronic device is an organic field effect transistor, the precursor can be the substrate with the gate, or the substrate with the source/drain electrodes and the semiconducting layer.

If the electronic device is an organic field-effect transistor, and the layer formed from the composition of the present invention is the dielectric layer, the organic field effect transistor can be, for example, prepared as follows:

The source and drain electrodes can be formed by lithographically patterning a suitable source/drain material, for example gold, on a suitable substrate, for example PET. The source/drain electrodes can then be covered with a semiconducting layer by spin-coating a solution of a semiconducting material, for example a DPP polymer, in a suitable solvent, for example toluene, on the substrate. The wet semiconducting layer can be heated. The semiconducting layer can then be covered with a dielectric layer by spin-coating the composition of the present invention on the semiconducting layer. The wet dielectric layer can be heated to 80 to 100° C., and then, if the composition of the present invention comprises a crosslinker of formula (12), cured by light treatment. The gate electrode can then be deposited on the dielectric layer for example by vapour deposition of a suitable source/drain material, for example gold Also part of the present invention is an electronic device which comprises a layer formed from the composition of the present invention and prepared according to the process of the present invention.

Also part of the present invention is the use of the composition of the present invention for forming a dielectric layer, a resist layer, an insulating layer, a passivation layer, a planarization layer, an encapsulation layer or a coating layer, preferably a dielectric layer.

The polymers of the present invention are advantageous as they are suitable for preparing the dielectric layer in an organic field effect transistor, which transistor can be operated with low voltages. In addition, the polymers of the present invention are advantageous as they are soluble in common organic solvents and thus compatible with liquid processing techniques. Furthermore, the compositions comprising the polymers of the present invention can be processed under ambient conditions (with regard to temperature, humidity, air) to form a layer of an electronic device and even though, the compositions are processed under ambient conditions, reliable and long-lasting electronic devices are obtained. The polymers of the present invention are in particular not prone to moisture-uptake, during processing as well as after electronic device fabrication, and thus electronic devices comprising a dielectric layer formed from the polymers of the present invention do not require an additional passivation or encapsulation layer. In this regard, the polymers of the present invention are clearly advantageous to other polymers such as polyvinylphenol, which are prone to moisture-uptake. In addition, the compositions comprising the polymers of the present invention and a crosslinker, for example the crosslinker of formula (12), can be cured by light treatment under ambient conditions (with regard to temperature, humidity, air), and, even though the curing is performed under ambient conditions, the cured layer is highly stable towards solvent dissolution.

EXAMPLES

Example 1

Preparation of Compound 2a

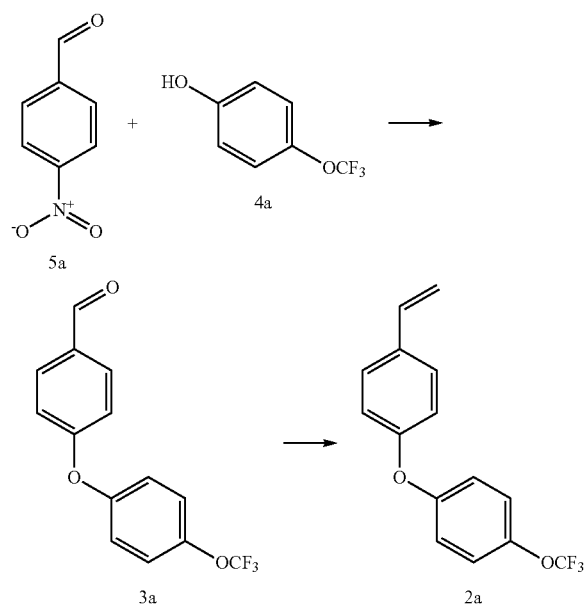

Figure 1:
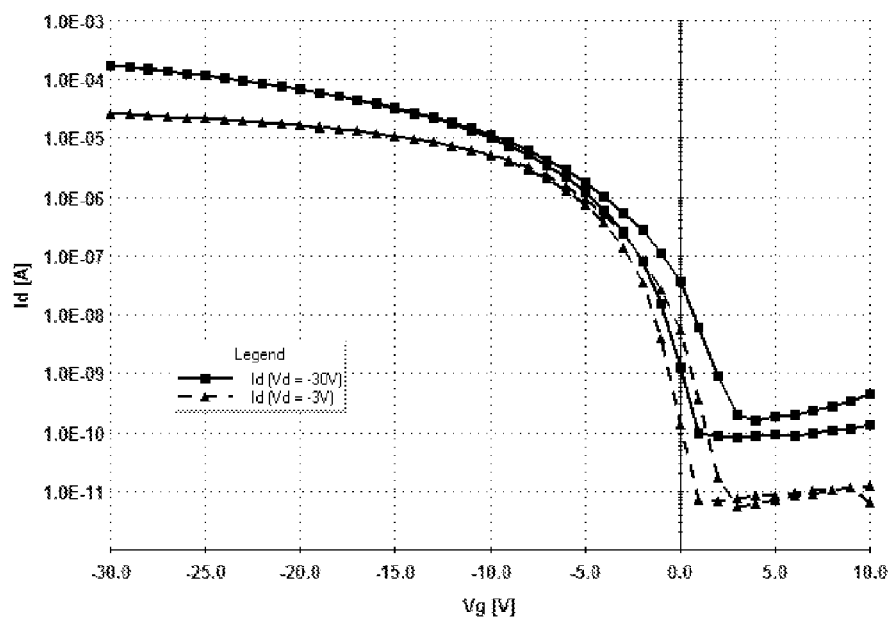
FIG. 1 shows the drain current $I_{ds}$ in relation to the gate voltage $V_{gs}$ (transfer curve) for a top-gate, bottom-contact (TGBC) field effect transistor comprising polymer PB as dielectric material at a source voltage $V_{ds}$ of −3V (triangle), respectively, −30V (square) is shown in FIG. 1.

Preparation of Compound 3a 4-nitrobenzaldehyde (30.0 g, 198.5 mmol, 1 eq.), Cu(OAc)$_2$ hydrate (0.05 eq.), Cs$_2$CO$_3$ (2 eq.) and compound 4a (2 eq.) were dissolve in DMF (450 mL) under inert atmosphere (N$_2$). Then, the reaction mixture was stirred at 100° C. for 4 hrs. The reaction mixture was diluted with ethyl acetate, filtered over a Buchner funnel, washed with aqueous NaOH (1×20 mL) and water (1×20 mL). The organic phases were gathered, dried over MgSO$_4$ and evaporated under reduced pressure. Purification was performed by column chromatography, employing hexane/DCM (7:3) as eluent giving compound 3a as a yellow oil (86% yield). $^1$H-NMR (400 MHz, CDCl$_3$), δ (ppm): 9.94 (s, 1H), 7.87 (m, 2H), 7.26 (m, 2H), 7.11-7.06 (m, 4H). m/z (EI)=(M+H)$^+$=283.

Preparation of Compound 2a

Methyltriphenylphosphonium bromide (148 g, 3.4 eq) was dissolved in anhydrous THF (500 mL) under N$_2$ and the resulting solution was cooled to −40° C. Potassium tert-butoxide (6 eq) was then added and the reaction mixture was stirred for 30 mins. Compound 3a (1 eq) dissolved in anhydrous THF (200 mL) was subsequently added and the reaction mixture was stirred for 3 hrs at −40° C., and then warmed to room temperature. The reaction mixture was filtered over a Buchner funnel and the solvent removed under reduced pressure. Column chromatography was employed to purify compound 2a using hexane/DCM (9:1) as the eluent. Compound 2a was obtained in 84% as colourless oil. $^1$H-NMR (400 MHz, CDCl$_3$), δ (ppm): 7.40 (d, J=8.8 Hz, 2H), 7.15 (d, J=12.8 Hz, 2H), 7.02-6.96 (m, 4H), 6.70 (dd, J=20 Hz, J$_1$=12.4 Hz, 1H), 5.68 (d, J=20 Hz, 1H), 5.22 (d, J=12.4 Hz, 1H). m/z (EI)=(M+H)$^+$=281.

Example 2

Preparation of Compound 2b

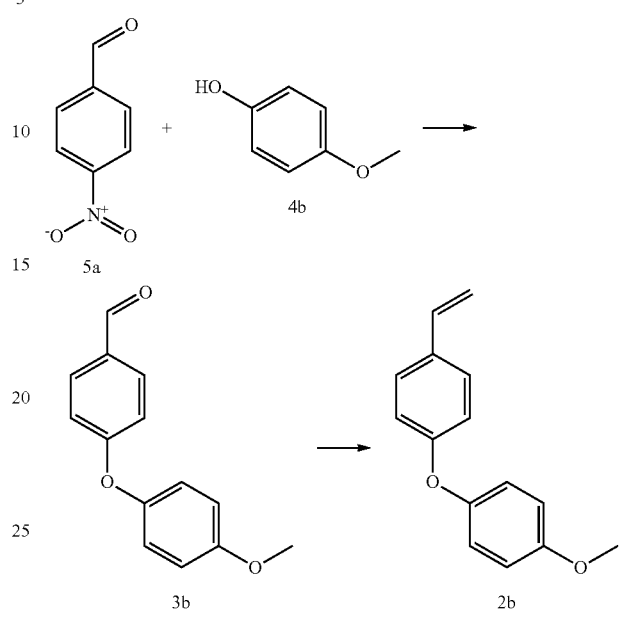

Preparation of Compound 3b

Compound 3b was prepared in analogy to compound 3a in example 1, but using compound 4b instead of compound 4a. Purification was performed by column chromatography, employing hexane/ethyl acetate (5:1) as eluent giving compound 3b as orange solid (48% yield). $^1$H-NMR (400 MHz, CDCl$_3$), δ (ppm): 9.88 (s, 1H), 7.80 (d, 2H), 7.02 (m, 4H), 6.95 (d, 2H), 3.81 (s, 3H). Data are in agreement with those reported in the literature Tetrahedron 2013, 69, 6884.

Preparation of Compound 2b

Compound 2b was prepared in analogy to compound 2a in example 1, but using compound 3b instead of compound 3a. Purification was performed by column chromatography, employing hexane/ethyl acetate (5:1) as eluent giving compound 2a as white solid (72% yield). $^1$H-NMR (400 MHz, CD$_2$Cl$_2$), δ (ppm): 7.35 (d, J=8.8 Hz, 2H), 6.97 (d, J=9.2 Hz, 2H), 6.88 (m, 4H), 6.67 (dd, J=17.6 Hz, J$_1$=11.2 Hz, 1H), 5.65 (d, J=17.6 Hz, 1H), 5.17 (d, J=11.2 Hz, 1H), 3.79 (s, 3H). m/z (EI)=(M+H)$^+$=226.3.

Example 3

Preparation of Compound 2c

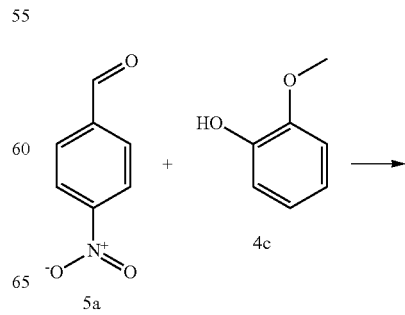

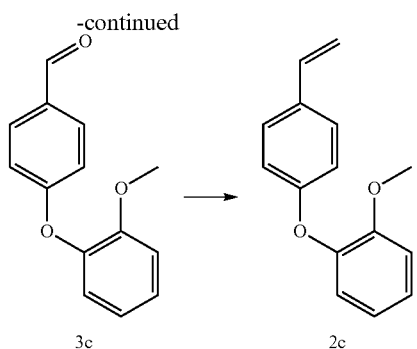

3c → 2c

Preparation of Compound 3c

Compound 3c was prepared in analogy to compound 3a in example 1, but using compound 4c instead of compound 4a. Purification was performed by column chromatography, employing hexane/ethyl acetate (5:1) as eluent giving compound 3c as orange oil (77% yield). $^1$H-NMR (400 MHz, CDCl$_3$), δ (ppm): 9.88 (s, 1H), 7.79 (m, 2H), 7.20 (m, 1H), 7.07 (m, 1H), 6.96 (m, 4H), 3.77 (s, 3H). m/z (EI)=(M+H)$^+$=229.

Preparation of Compound 2c

Compound 2c was prepared in analogy to compound 2a in example 1, but using compound 3c instead of compound 3a. Column chromatography was employed to purify compound 2c using hexane/ethyl acetate (5:1) as the eluent. Compound 2c was obtained in 40% yield as yellow solid. $^1$H-NMR (400 MHz, CDCl$_3$), δ (ppm): 7.35 (m, 2H), 7.15 (m, 1H), 7.3-6.90 (5H), 6.68 (dd, J=17.6 Hz, J$_1$=10.8 Hz, 1H), 5.65 (d, J=17.6 Hz, 1H), 5.16 (d, J=10.38 Hz, 1H), 3.82 (s, 3H). m/z (EI)=(M+H)$^+$=227.

Example 4

Preparation of Compound 2d

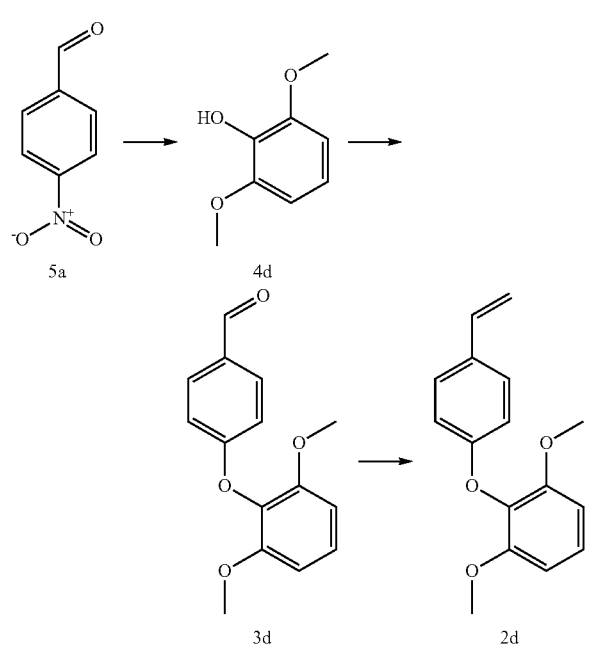

5a → 4d → 3d → 2d

Preparation of Compound 3d

Compound 3d was prepared in analogy to compound 3a in example 1, but using compound 4d instead of compound 4a. Purification was performed by column chromatography, employing hexane/ethyl acetate (5:1) as eluent giving compound 3d as a yellow oil (30% yield). $^1$H-NMR (400 MHz, CDCl$_3$), δ (ppm): 9.87 (s, 1H), 7.77 (m, 2H), 7.16 (m, 1H), 6.95 (m, 2H), 6.65 (m, 2H), 3.75 (s, 6H). m/z (EI)=(M+H)$^+$=259.1

Preparation of Compound 2d

Compound 2d was prepared in analogy to compound 2a in example 1, but using compound 3d instead of compound 3a. Column chromatography was employed to purify compound 2d using hexane/ethyl acetate (5:1) as the eluent. Compound 2d was obtained in 81% yield as pale yellow solid. $^1$H-NMR (400 MHz, CDCl$_3$), δ (ppm): 7.30 (d, J=10 Hz, 2H), 7.15 (t, J=8.4 Hz, 1H), 6.81 (d, J=8.4 Hz, 2H), 6.66 (m, 3H), 5.60 (d, J=18 Hz, 1H), 5.11 (d, J=12 Hz, 1H), 3.77 (s, 6H). m/z (EI)=(M+H)$^+$=257.1

Example 5

Preparation of Compound 2e

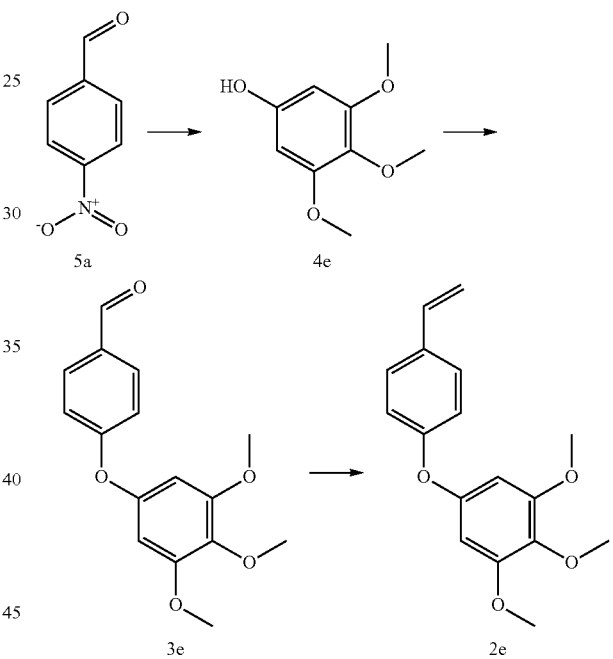

5a → 4e → 3e → 2e

Preparation of Compound 3e

Compound 3e was prepared in analogy to compound 3a in example 1, but using compound 4e instead of compound 4a. Purification was performed by column chromatography, employing hexane/ethyl acetate (5:1) as eluent giving compound 3e as a yellow solid (50% yield). $^1$H-NMR (400 MHz, CDCl$_3$), δ (ppm): 9.92 (s, 1H), 7.85 (d, J=8.8 Hz, 2H), 7.06 (d, J=8.8 Hz, 2H), 6.33 (s, 2H), 3.85 (s, 3H), 3.81 (s, 6H). m/z (EI)=(M+H)$^+$=289.1

Preparation of Compound 2e

Compound 2e was prepared in analogy to compound 2a in example 1, but using compound 3e instead of compound 3a. Column chromatography was employed to purify compound 2e using hexane/ethyl acetate (5:1) as the eluent. Compound 2e was obtained in 66% yield as pale yellow oil. $^1$H-NMR (400 MHz, CDCl$_3$), δ (ppm): 7.37 (d, J=6.8 Hz, 2H), 6.96 (d, J=6.8 Hz, 2H), 6.69 (dd, J=17 Hz, J$_1$=11 Hz, 1H), 6.27 (s, 2H), 5.67 (d, J=17 Hz, 1H), 5.20 (d, J=11 Hz, 1H), 3.83 (s, 3H), 3.78 (s, 6H). m/z (EI)=(M+H)$^+$=287.1

Example 6

Preparation of Compound 2f

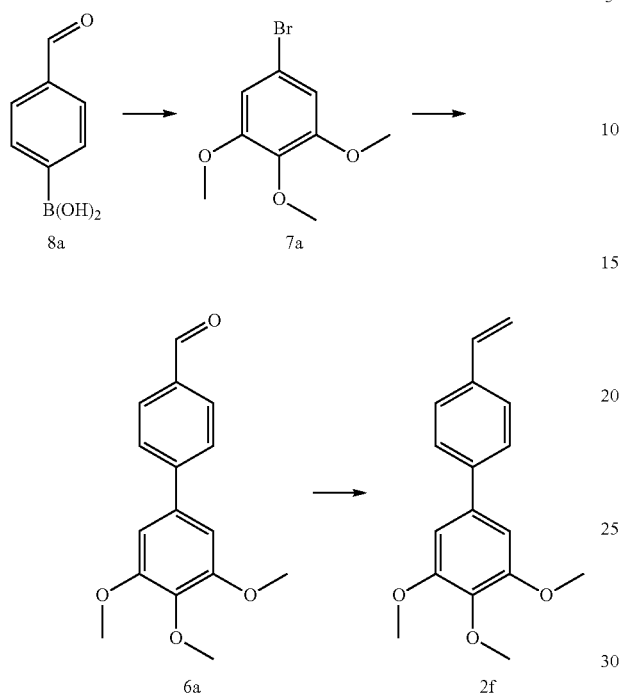

Preparation of Compound 6a (4-Formylphenyl)boronic acid (8a) (0.4 g, 2.6 mmol), 3,4,5-trimethoxy bromobenzene (7a) (0.5 g, 2.0 mmol) and tetra-n-butylammonium bromide (0.1 g, 0.4 mmol) were dissolved in toluene (5 mL) and a $K_2CO_3$ aqueous solution (5N, 1.6 mL) was subsequently added. The bilayer mixture was degassed with $N_2$ and finally tetrakis(triphenylphosphine)palladium (0.1 g, 0.1 mmol) was added under inert atmosphere. The reaction mixture was heated at 100° C. overnight. The reaction mixture was extracted with DCM (2×25 ml). The combined organic fractions were anhydrified over $MgSO_4$ and evaporated under reduced pressure. Crude compound 6a was purified by chromatography column, employing hexanes/ethyl acetate as the eluent. Compound 6a was obtained in 85% yield as a colorless oil. $^1$H-NMR (400 MHz, $CDCl_3$), δ (ppm): 10.06 (s, 1H), 7.94 (d, J=8 Hz, 2H), 7.71 (d, J=8 Hz, 2H), 6.82 (s, 2H), 3.94 (s, 6H), 3.91 (s, 3H).

Preparation of Compound 2f

Methyltriphenylphosphonium bromide (2.4 g, 6.8 mmol) was dissolved in anhydrous THF (15 mL) under $N_2$ and the reaction mixture was cooled to −40° C. Potassium tert butoxide (1.3 g, 12 mmol) was then added and the solution turned dark. After stirring for 30 mins compound 6a (0.5 g, 2.0 mmol) in 5 mL of THF was added and the reaction mixture was allowed to warm up to room temperature, while being stirred overnight. The reaction mixture was filtered over a Buchner funnel, the solvent was removed under reduced pressure and the crude compound 2f was purified by column chromatography over silica gel employing hexane/ethyl acetate (8/2) as the eluent. Compound 2f was obtained in 76% yield as a white solid. $^1$H-NMR (400 MHz, $CDCl_3$), δ (ppm): 7.50 (d, J=8 Hz, 2H), 7.47 (d, J=8 Hz, 2H), 6.78 (s, 2H), 6.75 (dd, J=17 Hz, $J_2$=11 Hz, 1H, overlapping with singlet at 6.78), 5.79 (d, J=17 Hz, 1H), 5.27 (d, J=11 Hz, 1H), 3.92 (s, 6H), 3.89 (s, 3H). m/z (EI)=(M+H)$^+$=271.1.

Example 7

Preparation of Polymer Pa

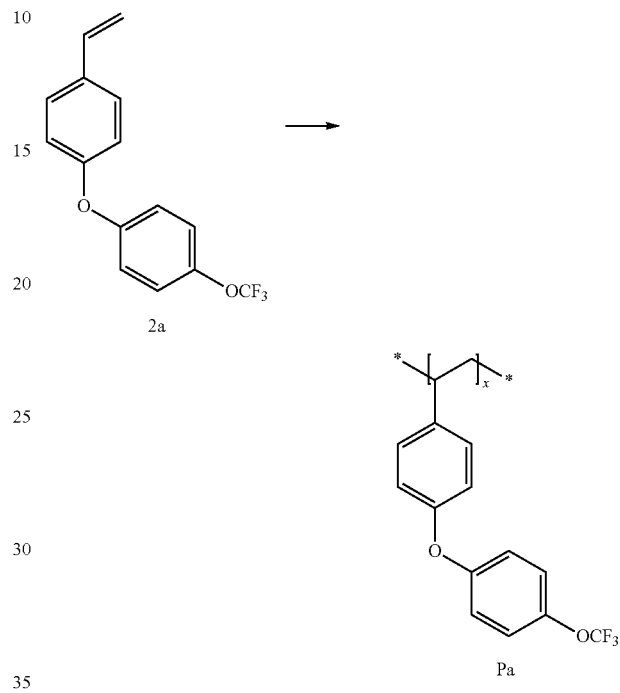

Compound 2a (1 g, 4.7 mmol) was heated at 125° C. under nitrogen atmosphere in neat conditions. After overnight heating, the polymer formed was dissolved in toluene and precipitated by pouring this solution into methanol to give a white solid. The isolated polymer was re-dissolved in THF and precipitated again by pouring this solution into methanol. The precipitation process was repeated once more. Polymer Pa was obtained in 53% yield. Mw 151000 Da. Polydispersity (PDI) 2.5. Tg 62° C. Relative permittivity (at 1 kHz, 25° C.) 2.7.

Example 8

Preparation of Polymer Pb

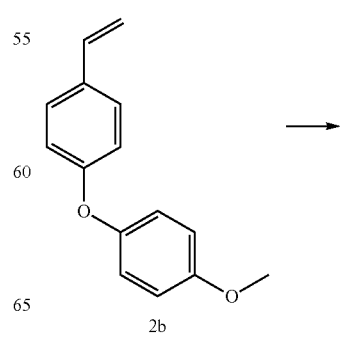

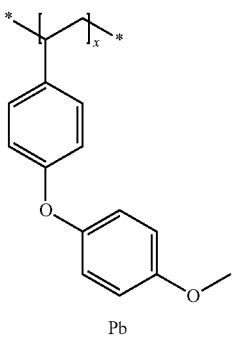

Compound 2b (1 g, 4.4 mmol) and 1,1'-azobis(cyclohexanecarbonitrile) (10 mg, 0.04 mmol, 1% eq) were dissolved in anhydrous toluene (3 mL). The solution was degassed by three cycles of freeze-pump-thaw. The reaction mixture was stirred at 80° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Polymer Pb was obtained in 60% yield as white solid. Mw 70000 Da. Polydispersity (PDI) 2.1. Tg 80° C. Relative permittivity (at 1 kHz, 25° C.) 3.2.

Example 9

Preparation of Polymer Pc

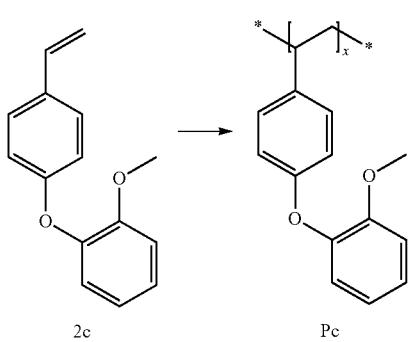

Compound 2c (1 g, 4.4 mmol) and 1,1'-azobis(cyclohexanecarbonitrile) (10 mg, 0.04 mmol, 1% eq) were dissolved in anhydrous toluene (3 mL). The solution was degassed by three cycles of freeze-pump-thaw. The reaction mixture was stirred at 80° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Polymer Pc was obtained in 33% yield as white solid. Mw 129000 Da. Polydispersity (PDI) 2.2. Tg 97° C. Relative permittivity (at 1 kHz, 25° C.) 3.1.

Example 10

Preparation of Polymer Pd

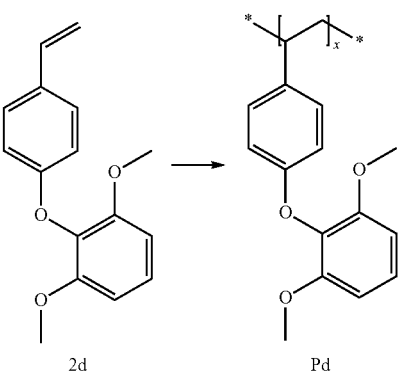

Compound 2d (3 g, 11.7 mmol) and 1,1'-azobis(cyclohexanecarbonitrile) (12 mg, 0.05 mmol, 1% eq), were dissolved in anhydrous toluene (7 mL). The solution was degassed by three cycles of freeze-pump-thaw. The reaction mixture was stirred at 80° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Polymer Pd was obtained in 37% yield as white solid. Mw 176000 Da. Polydispersity (PDI) 2.2. Tg 1480C. Relative permittivity (at 1 kHz, 25° C.) 3.6.

Example 11

Preparation of Polymer Pe

-continued

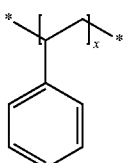

Pe

Compound 2e (1 g, 4.5 mmol) and 1,1'-azobis(cyclohexanecarbonitrile) (8 mg, 0.03 mmol 1% eq) were dissolved in anhydrous toluene (3 mL). The solution was degassed by three cycles of freeze-pump-thaw. The reaction mixture was stirred at 80° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Polymer Pe was obtained in 85% yield as white solid. Mw 220000 Da. Polydispersity (PDI) 2.1. Tg 104° C. Relative permittivity (at 1 kHz, 25° C.) 3.7.

Example 12

Preparation of Polymer Pf

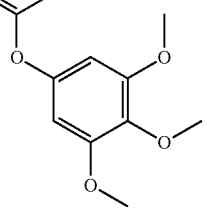

2f                                    Pf

Compound 2f (5 g, 18 mmol) and dicumyl peroxide (50 mg, 0.18 mmol), were dissolved in anhydrous toluene (11 mL). The solution was degassed by three cycles of freeze-pump-thaw. The reaction mixture was stirred at 95° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Polymer Pf was obtained in 93% yield as white solid. Mw 114000 Da. Polydispersity (PDI) 2.5. Tg 145° C. Relative permittivity (at 1 kHz, 25° C.) 3.6.

Example 13

Preparation of Polymer Pg

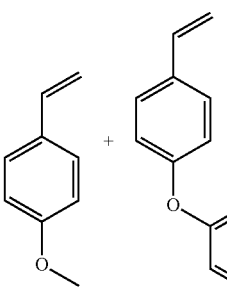

9a            2c

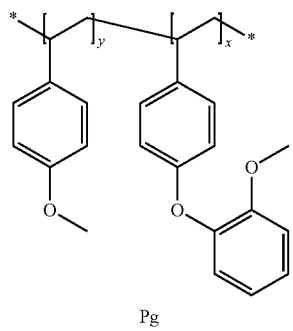

Pg

Compound 9a (1.1 g, 7.9 mmol), compound 2c (1.2 g, 5.3 mmol) and dicumyl peroxide (36 mg, 0.13 mmol, 1% eq) were dissolved in anhydrous toluene (6 mL). The solution was degassed by three cycles of freeze-pump-thaw. The reaction mixture was stirred at 95° C. under nitrogen atmosphere for 2 days. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Random polymer Pg was obtained in 44% yield as white solid. Mw 137000 Da. Polydispersity (PDI) 2.4. Tg 102° C. Relative permittivity (at 1 kHz, 25° C.) 3.3.

Example 14

Preparation of Polymer Ph

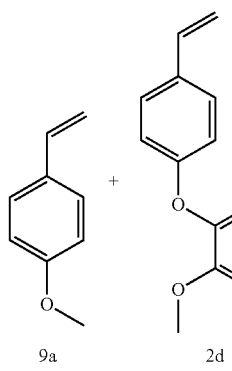

9a            2d

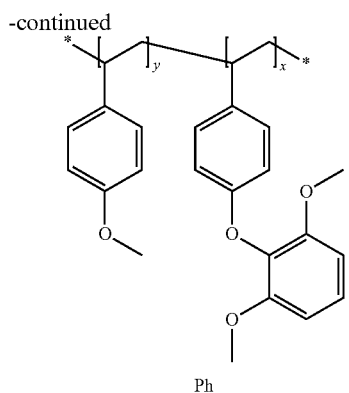

Compound 9a (1.2 g, 8.7 mmol), compound 2d (1.5 g, 5.8 mmol) and dicumyl peroxide (39 mg, 0.14 mmol, 1% eq) were dissolved in anhydrous toluene (6 mL). The solution was degassed by three cycles of freeze-pump-thaw. The reaction mixture was stirred at 95° C. under nitrogen atmosphere overnight. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Random polymer Ph was obtained in 48% yield as white solid. Mw 115000 Da. Polydispersity (PDI) 2.1. Tg 138° C. Relative permittivity (at 1 kHz, 25° C.) 3.4.

Example 15

Preparation of Polymer Pi

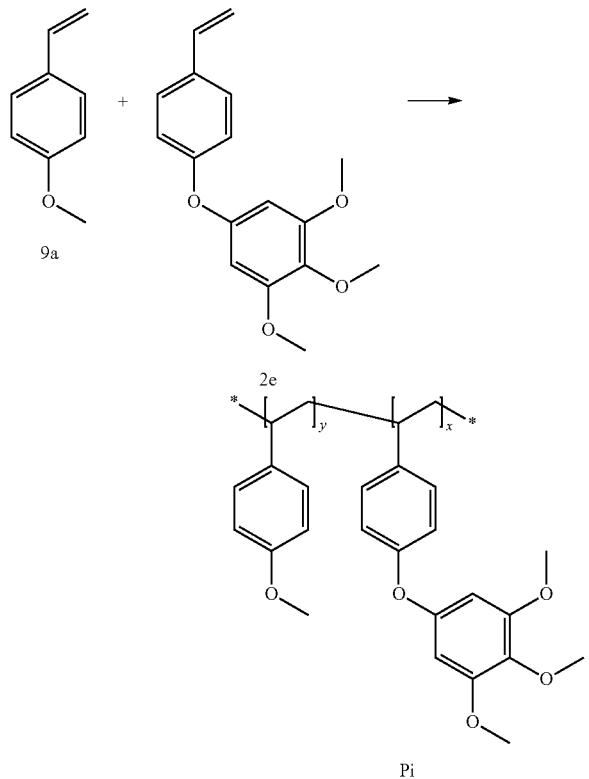

Compound 9a (0.8 g, 6.3 mmol), compound 2e (1.2 g, 4.2 mmol) and 1,1'-azobis(cyclohexanecarbonitrile) (25 mg, 0.10 mmol, 1% eq) were dissolved in anhydrous toluene (6 mL). The solution was degassed by three cycles of freeze-pump-thaw. The reaction mixture was stirred at 95° C. under nitrogen atmosphere overnight. The reaction mixture diluted with toluene under ambient conditions, and the diluted reaction mixture was poured into methanol to precipitate the polymer. The isolated polymer was re-dissolved in THF and precipitated again by pouring the solution into methanol. The precipitation process was repeated once more. Random polymer Pi was obtained in 42% yield as white solid. Mw 140000 Da. Polydispersity (PDI) 1.9. Tg 107° C. Relative permittivity (at 1 kHz, 25° C.) 3.0.

Example 16

Preparation of a Top-Gate, Bottom-Contact Field Effect Transistor Comprising Polymer Pb as Dielectric Material Gold was sputtered onto PET substrate to form approximately 40 nm thick gold source/drain electrodes. A 0.75% (weight/weight) solution of the diketopyrrolopyrrole (DPP)-thiophenepolymer of example 1 of WO 2010/049321 in toluene was filtered through a 0.45 micrometer polytetrafluoroethylene (PTFE) filter and then applied by spin coating (1,000 rpm, 30 seconds). The wet organic semiconducting layer was dried at 90° C. on a hot plate for 60 seconds. A solution of 100 mg/ml of polymer Pb, prepared as described in example 8, in butyl acetate, containing 4% by weight of a 2,7-bis[2-(4-azido-2,3,5,6-tetrafluoro-phenyl)ethynyl]-9,9-dihexyl-fluorene as crosslinker based on the weight of polymer Pb, was filtered through a 0.45 micrometer filter. The solution was spin-coated (1500 rpm, 30 seconds) on the semiconducting layer. The wet dielectric layer was pre-baked at 90° C. for 2 minutes and subsequently UV-cured by irradiating at 365 nm with a dosage of ~60mJ/cm² under ambient conditions. Gate electrodes of gold (thickness approximately 80 nm) were evaporated through a shadow mask on the dielectric layer.

The top gate, bottom contact (TGBC) field effect transistor was measured by using a Keithley 4200-SCS semiconductor characterization system.

The drain current $I_{ds}$ in relation to the gate voltage $V_{gs}$ (transfer curve) for the top-gate, bottom-contact (TGBC) field effect transistor at a source voltage $V_{ds}$ of −3V (triangle), respectively, −30V (square) is shown in FIG. 1.

The charge-carrier mobility was extracted in the saturation regime from the slope of the square root drain current $I_{ds}^{1/2}$ versus gate-source voltage $V_{gs}$. The threshold voltage $V_{on}$ was obtained using the following equation: $\mu = 2I_{ds}/\{(W/L)Ci(V_{gs}-V_{on})^2\}$, wherein Ci is the capacitance per unit of the dielectric layer.

The average values of the charge carrier mobility μ, the $I_{on}/I_{off}$ ratio and the onset voltage $V_{on}$ for the organic field effect transistor are given in table 1.

TABLE 1

| Polymer | charge carrier mobility [cm²/Vs] | $I_{on}/I_{off}$ | $V_{on}$ [V] | Ig @ −30 V [A] |
|---|---|---|---|---|
| Pb | 0.132 | 8.15E+05 | 3 | 3.15E−07 |

Example 17

Preparation of Capacitor Comprising a Dielectric Layer Formed from Polymers Pb

A solution of 60 mg/ml of polymer Pb, prepared as described in example 8, in butyl acetate was filtered through a 0.45 micrometer filter and applied on a clean glass substrate pre-coated with indium tin oxide (ITO) electrodes by spin coating (1000 rpm, 30 seconds). The wet dielectric layer was dried at 90° C. for 2 minutes on a hot plate to obtain a ~400 nm thick layer. Gold electrodes (area=0.785 mm$^2$) were then vacuum-deposited through a shadow mask on the dielectric layer at <1×10$^{-6}$ Torr (1.3×10$^{-4}$ Pa).

The capacitor obtained was characterized in the following way: The relative permittivity was deduced from the capacitance measured with Agilent E4980A Precision LCR Meter (signal amplitude 1 V).

The results are depicted in table 2.

TABLE 2

| Frequency [Hz] | Relative permittivity |
| --- | --- |
| 40 | 3.16 |
| 4000 | 3.18 |
| 1000000 | 3.16 |

Example 18

Stability of the Cured Dielectric Layer Formed from Polymer Pb Towards Solvent Dissolution Crosslinking test was performed by utilizing a dielectric solution of 80 mg/ml polymer Pb, prepared as described in example 8, in butyl acetate containing 4% by weight a 2,7-bis[2-(4-azido-2,3,5,6-tetrafluoro-phenyl)ethynyl]-9,9-dihexyl-fluorene as crosslinker based on the weight of polymer Pb. The solution was filtered through a 0.45 micrometer polytetrafluoroethylene (PTFE) filter and coated on a clean silicon dioxide substrate by spin coating (1500 rpm, 30 s). The wet dielectric layer was pre-baked at 90° C. for 2 minutes on a hotplate to obtain a ~500 nm thick film. The dielectric layer was exposed to 365 nm UV radiation under ambient conditions by employing a dosage of ~60mJ/cm$^2$. Post baking was done at 90° C. for 2 min on hotplate. Dielectric layer was developed by immersing the dielectric layer into butyl acetate for 1 minute followed by nitrogen blowing and drying at 90° C. for 5 minutes. The thickness of the dielectric layer was measured after curing before development (d1) and after development (d2) using Veeco Dektak 150 to obtain the film retention ratio (d2/d1). The average film retention ratio was 97%.

Example 19

Preparation of a Top-Gate, Bottom-Contact Field Effect Transistor Comprising Polymer Pe as Dielectric Material Gold was sputtered onto PET substrate to form approximately 40 nm thick gold source/drain electrodes. A 0.75% (weight/weight) solution of the diketopyrrolopyrrole semiconducting polymer of example 1 of WO 2013/083506 in toluene was filtered through a 0.45 micrometer polytetrafluoroethylene (PTFE) filter and then applied by spin coating (1,200 rpm, 30 seconds). The wet organic semiconducting layer was dried at 90° C. on a hot plate for 60 seconds. A solution of 100 mg/ml of polymer Pe, prepared as described in example 11, in mixture of propylene glycol monomethyl ether acetate (PGMEA) and butylacetate (BuAc) (70/30), containing 3% by weight of 2,7-bis[2-(4-azido-2,3,5,6-tetrafluoro-phenyl)ethynyl]-9,9-dihexyl-fluorene as crosslinker based on the weight of polymer Pe, was filtered through a 0.45 micrometer filter. The solution was spin-coated (2000 rpm, 30 seconds) on the semiconducting layer. The wet dielectric layer was pre-baked at 90° C. for 2 minutes and subsequently UV-cured by irradiating at 365 nm with a dosage of ~100mJ/cm$^2$ under ambient conditions. Afterwards, the device was wetted with a solution of PGMEA/BuAc (70/30) for 1 minute to develop the dielectric and spin-coated dry at (2000 rpm, 1 min) followed by a post-bake of 5 minutes at 90° C. on a hot plate. Gate electrodes of gold (thickness approximately 80 nm) were evaporated through a shadow mask on the dielectric layer.

The top gate, bottom contact (TGBC) field effect transistor was measured by using a Keithley 2612B sourcemeter.

Figure 2:
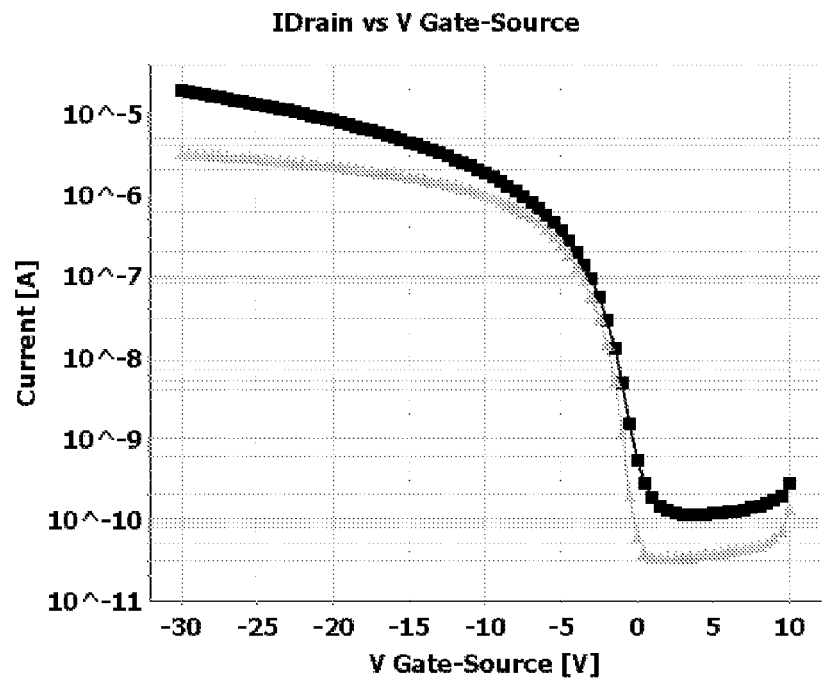
FIG. 2 shows the drain current $I_{ds}$ in relation to the gate voltage $V_{gs}$ (transfer curve) for a top-gate, bottom-contact

The drain current $I_{ds}$ in relation to the gate voltage $V_{gs}$ (transfer curve) for the top-gate, bottom-contact (TGBC) field effect transistor at a source voltage $V_{ds}$ of −5V (triangle), respectively, −30V (square) is shown in FIG. 2.

The charge-carrier mobility was extracted in the saturation regime from the slope of the square root drain current $I_{ds}^{1/2}$ versus gate-source voltage $V_{gs}$. The threshold voltage $V_{on}$ was obtained using the following equation: $\mu=2I_{ds}/\{(W/L)Ci(V_{gs}-V_{on})^2\}$, wherein Ci is the capacitance per unit of the dielectric layer and W/L is 25. The thickness of the dielectric has been measured by a profilometer to 468 nm.

The average values of the charge carrier mobility μ, the $I_{on}/I_{off}$ ratio and the onset voltage $V_{on}$ for the organic field effect transistor are given in table 3.

TABLE 3

| Polymer | charge carrier mobility [cm$^2$/Vs] | $I_{on}/I_{off}$ | $V_{on}$ [V] | Ig @ −30 V [A] |
| --- | --- | --- | --- | --- |
| Pe | 0.27 | 1.7E+05 | −0.5 | 2E7 |

Example 20

Preparation of a Capacitor Comprising Polymer Pe as Dielectric Material

A solution of 100 mg/ml of polymer Pe, prepared as described in example 11, in PGMEA/BuAc (70/30) was filtered through a 0.45 micrometer filter and applied on a clean glass substrate pre-coated with indium tin oxide (ITO) electrodes by spin coating (2000 rpm, 30 seconds). The wet dielectric layer was dried at 90° C. for 2 minutes to obtain a 550 nm thick layer. Gold electrodes (area=3.0 mm$^2$) were then vacuum-deposited through a shadow mask on the dielectric layer at <1×10$^{-5}$ mbar The capacitor obtained was characterized in the following way: The relative permittivity was deduced from the capacitance measured with Agilent 4284A Precision LCR Meter (signal amplitude 1 V).

The results are depicted in table 4.

TABLE 4

| Frequency [Hz] | Relative permittivity |
| --- | --- |
| 20 | 3.57 |
| 100 | 3.55 |
| 100000 | 3.45 |

Example 21

Stability of the Cured Dielectric Layer Formed from Polymer Pe Towards Solvent Dissolution Crosslinking test was performed by utilizing a dielectric solution of 40 mg/ml polymer Pe (Mw 130'000) in butyl acetate containing 4% by weight a 2,7-bis[2-(4-azido-2,3,5,6-tetrafluorophenyl)ethynyl]-9,9-dihexyl-fluorene as crosslinker based on the weight of polymer Pe. The solution was filtered through a 0.45 micrometer polytetrafluoroethylene (PTFE) filter and coated on a clean silicon dioxide substrate by spin coating (3500 rpm, 30 s). The wet dielectric layer was pre-baked at 90° C. for 2 minutes on a hotplate to obtain a 520 nm thick film. A shadow mask was aligned on top of the dielectric layer before curing using 365 nm (radiation dosage 60 mJ/cm2) in ambient conditions, in the presence of oxygen. The cured film was developed by immersing the film into butyl acetate for 1 minute followed by blowing with nitrogen and heating at 90° C. for 5 minutes. The thickness of the dielectric layer was measured after curing before development (d1) and after development (d2) using Veeco Dektak 150 to obtain the film retention ratio (d2/d1). The average film retention ratio was 94%.

Comparative Example 1

Stability of a Cured Dielectric Layer Formed from Polystyrene Towards Solvent Dissolution Crosslinking test was performed by utilizing a dielectric solution of 40 mg/ml polystyrene (Mw~2,000,000, supplied by Pressure Chemicals) in butyl acetate containing 4% by weight a 2,7-bis[2-(4-azido-2,3,5,6-tetrafluoro-phenyl)ethynyl]-9,9-dihexyl-fluorene as crosslinker based on the weight of polystyrene. The solution was filtered through a 0.45 micrometer polytetrafluoroethylene (PTFE) filter and coated on a clean silicon dioxide substrate by spin coating (3500 rpm, 30 s). The wet dielectric layer was pre-baked at 90° C. for 2 minutes on a hotplate to obtain a 520 nm thick film. A shadow mask was aligned on top of the dielectric layer before curing using 365 nm (radiation dosage 60 mJ/cm2) in ambient conditions, in the presence of oxygen. The cured film was developed by immersing the film into butyl acetate for 1 minute followed by blowing with nitrogen and heating at 90° C. for 5 minutes. The thickness of the dielectric layer was measured after curing before development (d1) and after development (d2) using Veeco Dektak 150 to obtain the film retention ratio (d2/d1). The average film retention ratio was 50%.

Example 21 and Comparative Example 1 show that the stability of the cured dielectric layer formed from polymer Pe towards solvent dissolution is higher than the stability of the cured dielectric layer from polystyrene (Mw~2,000,000, supplied by Pressure Chemicals) towards solvent dissolution when the polymer is applied, cured and developed under ambient conditions.

The invention claimed is:

1. A polymer, comprising:
at least one unit of formula (1):

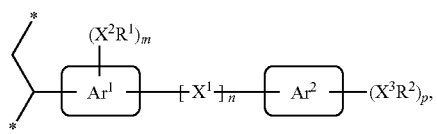

(1)

wherein:
n is 0 or 1;
m and p are independently from each other 0, 1, 2, 3, 4, 5 or 6,
provided that the sum of n, m and p is at least 2, and n and p are not 0 at the same time;
$Ar^1$ and $Ar^2$ are independently from each other a $C_{6-14}$-arylene or a $C_{6-14}$-aryl, which may be substituted with 1 to 4 substituents independently selected from the group consisting of a $C_{1-30}$-alkyl, a $C_{2-30}$-alkenyl, a $C_{2-30}$-alkynyl, a $C_{5-8}$-cycloalkyl, a $C_{6-14}$-aryl and a 5 to 14 membered heteroaryl;
$X^1$, $X^2$ and $X^3$ are independently from each other and at each occurrence O or S;
$R^1$ and $R^2$ are independently from each other and at each occurrence selected from the group consisting of a $C_{1-30}$-alkyl, a $C_{2-30}$-alkenyl, a $C_{2-30}$-alkynyl, a $C_{5-8}$-cycloalkyl, a $C_{6-14}$-aryl and a 5 to 14 membered heteroaryl;
$C_{1-30}$-alkyl, $C_{2-30}$-alkenyl and $C_{2-30}$-alkynyl can be substituted with 1 to 5 substituents independently selected from the group consisting of a halogen, CN, a $C_{5-6}$-cycloalkyl, a $C_{6-10}$-aryl and a 5 to 10 membered heteroaryl;
$C_{5-8}$-cycloalkyl can be substituted with 1 to 5 substituents independently selected from the group consisting of a halogen, a $C_{1-10}$-alkyl, CN, a $C_{2-10}$-alkenyl, a $C_{2-10}$-alkynyl, a $C_{6-10}$-aryl and a 5 to 10 membered heteroaryl; and
$C_{6-14}$-aryl and 5 to 14 membered heteroaryl can be substituted with 1 to 5 substituents independently selected from the group consisting of a halogen, CN, a $C_{1-10}$-alkyl, a $C_{2-10}$-alkenyl, a $C_{2-10}$-alkynyl and a $C_{5-6}$-cycloalkyl.

2. The polymer of claim 1, wherein:
n is 0 or 1; and
m and p are independently from each other 0, 1, 2, 3 or 4,
provided that the sum of n, m and p is at least 2, and n and p are not 0 at the same time.

3. The polymer of claim 1, wherein:
n is 0 or 1; and
m and p are independently from each other 0, 1, 2, 3 or 4,
provided that the sum of n and p is at least 2.

4. The polymer of claim 1, wherein:
n is 0 or 1; and
m and p are independently from each other 0, 1, 2, 3 or 4,
provided that the sum of n and p is at least 3.

5. The polymer of claim 1, wherein:
$Ar^1$ and $Ar^2$ are independently from each other a phenylene or phenyl, which may be substituted with 1 to 4 substituents independently selected from the group consisting of a $C_{1-30}$-alkyl, a $C_{2-30}$-alkenyl, a $C_{2-30}$-alkynyl, a $C_{5-8}$-cycloalkyl, a $C_{6-14}$-aryl and a 5 to 14 membered heteroaryl;
$C_{1-30}$-alkyl, $C_{2-30}$-alkenyl and $C_{2-30}$-alkynyl can be substituted with 1 to 5 substituents independently selected from the group consisting of a halogen, CN, a $C_{5-6}$-cycloalkyl, a $C_{6-10}$-aryl, and a 5 to 10 membered heteroaryl;
$C_{5-8}$-cycloalkyl can be substituted with 1 to 5 substituents independently selected from the group consisting of a halogen, CN, a $C_{1-10}$-alkyl, a $C_{2-10}$-alkenyl, a $C_{2-10}$-alkynyl, a $C_{6-10}$-aryl and a 5 to 10 membered heteroaryl; and
$C_{6-14}$-aryl and 5 to 14 membered heteroaryl can be substituted with 1 to 5 substituents independently selected from the group consisting of a halogen, CN, a $C_{1-10}$-alkyl, a $C_{2-10}$-alkenyl, a $C_{2-10}$-alkynyl and a $C_{5-6}$-cycloalkyl.

6. The polymer of claim 1, wherein:
$Ar^1$ and $Ar^2$ are independently from each other a phenylene or phenyl, which may be substituted with 1 to 4 substituents independently selected from the group consisting of a $C_{1-20}$-alkyl, a $C_{2-20}$-alkenyl and a $C_{2-20}$-alkynyl; and
$C_{1-20}$-alkyl, $C_{2-20}$-alkenyl and $C_{2-20}$-alkynyl can be substituted with 1 to 5 substituents independently selected from the group consisting of a halogen, CN, a $C_{5-6}$-cycloalkyl, a $C_{6-10}$-aryl and a 5 to 10 membered heteroaryl.

7. The polymer of claim 1, wherein Ar$^1$ and Ar$^2$ are independently from each other an unsubstituted phenylene or phenyl.

8. The polymer of claim 1, wherein:
at least one of n, m and p is not 0, and
X$^1$, X$^2$ and X$^3$ are O.

9. The polymer of claim 1, wherein:
R$^1$ and R$^2$ are independently from each other and at each occurrence selected from the group consisting of a C$_{1-20}$-alkyl, a C$_{2-20}$-alkenyl, a C$_{2-20}$-alkynyl and phenyl;
C$_{1-20}$-alkyl, C$_{2-20}$-alkenyl and C$_{2-20}$-alkynyl can be substituted with 1 to 5 substituents independently selected from the group consisting of a halogen, CN, a C$_{5-6}$-cycloalkyl, a C$_{6-10}$-aryl and a 5 to 10 membered heteroaryl; and
phenyl can be substituted with 1 to 5 substituents independently selected from the group consisting of a halogen, CN, a C$_{1-10}$-alkyl, a C$_{2-10}$-alkenyl, a C$_{2-10}$-alkynyl and a C$_{5-6}$-cycloalkyl.

10. The polymer of claim 1, wherein:
R$^1$ and R$^2$ are independently from each other and at each occurrence selected from the group consisting of a C$_{1-10}$-alkyl and phenyl;
C$_{1-10}$-alkyl can be substituted with 1 to 5 substituents independently selected from the group consisting of a halogen and phenyl; and
phenyl can be substituted with 1 to 5 substituents independently selected from the group consisting of a halogen and C$_{1-6}$-alkyl.

11. The polymer of claim 1, wherein:
at least one of m and p is not 0;
R$^1$ and R$^2$ area C$_{1-6}$-alkyl; and
C$_{1-6}$-alkyl can be substituted with 1 to 3 of a halogen.

12. The polymer of claim 1, which is a copolymer comprising:
at least one unit of formula (1):

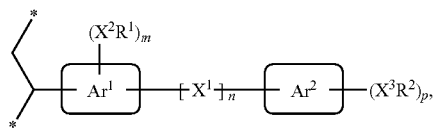

(1)

and at least one unit of formula (10):

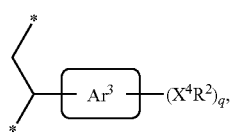

(10)

wherein:
n is 0 or 1;
m and p are independently from each other 0, 1, 2, 3, 4, 5 or 6,
provided that the sum of n, m and p is at least 2, and n and p are not 0 at the same time;
q is 0, 1, 2, 3, 4, 5 or 6;
Ar$^1$, Ar$^2$ and Ar$^3$ are independently from each other a C$_{6-14}$-arylene or a C$_{6-14}$-aryl, which may be substituted with 1 to 4 substituents independently selected from the group consisting of a C$_{1-30}$-alkyl, a C$_{2-30}$-alkenyl, a C$_{2-30}$-alkynyl, a C$_{5-8}$-cycloalkyl, a C$_{6-14}$-aryl and a 5 to 14 membered heteroaryl;
X$^1$, X$^2$, X$^3$, and X$^4$ are independently from each other and at each occurrence O or S;
R$^1$, R$^2$ and R$^3$ are independently from each other and at each occurrence selected from the group consisting of a C$_{1-30}$-alkyl, a C$_{2-30}$-alkenyl, a C$_{2-30}$-alkynyl, a C$_{5-8}$-cycloalkyl, a C$_{6-14}$-aryl and a 5 to 14 membered heteroaryl;
C$_{1-30}$-alkyl, C$_{2-30}$-alkenyl and C$_{2-30}$-alkynyl can be substituted with 1 to 5 substituents independently selected from the group consisting of a halogen, CN, a C$_{5-6}$-cycloalkyl, a C$_{6-10}$-aryl and a 5 to 10 membered heteroaryl;
C$_{5-8}$-cycloalkyl can be substituted with 1 to 5 substituents independently selected from the group consisting of a halogen, CN, a C$_{1-10}$-alkyl, a C$_{2-10}$-alkenyl, a C$_{2-10}$-alkynyl, a C$_{6-10}$-aryl and a 5 to 10 membered heteroaryl; and
C$_{6-14}$-aryl and 5 to 14 membered heteroaryl can be substituted with 1 to 5 substituents independently selected from the group consisting of a halogen, CN, a C$_{1-10}$-alkyl, a C$_{2-10}$-alkenyl, a C$_{2-10}$-alkynyl and a C$_{5-6}$-cycloalkyl.

13. A composition, comprising:
the polymer of claim 1 and a solvent.

14. The composition of claim 13, further comprising:
a crosslinker.

15. A process for preparing an electronic device containing a layer formed from the composition of claim 13, the process comprising:
applying the composition on a pre-cursor of the electronic device in order to form the layer.

16. An electronic device obtained by the process of claim 15.

17. An article, comprising:
the polymer of claim 1,
wherein the article is selected from the group consisting of a dielectric layer, a resist layer, an insulating layer, a passivation layer, a planarization layer, an encapsulation layer and a coating layer.

* * * * *